(12) United States Patent
Igarashi et al.

(10) Patent No.: US 7,446,544 B2
(45) Date of Patent: Nov. 4, 2008

(54) PROBE APPARATUS, WAFER INSPECTING APPARATUS PROVIDED WITH THE PROBE APPARATUS AND WAFER INSPECTING METHOD

(75) Inventors: Hisao Igarashi, Chuo-ku (JP); Katsumi Sato, Chuo-ku (JP); Kazuo Inoue, Chuo-ku (JP)

(73) Assignee: JSR Corporation, Tokyo (JP)

( * ) Notice: Subject to any disclaimer, the term of this patent is extended or adjusted under 35 U.S.C. 154(b) by 95 days.

(21) Appl. No.: 10/593,830

(22) PCT Filed: Mar. 30, 2005

(86) PCT No.: PCT/JP2005/006108

§ 371 (c)(1),
(2), (4) Date: Sep. 22, 2006

(87) PCT Pub. No.: WO2005/096368

PCT Pub. Date: Oct. 13, 2005

(65) Prior Publication Data

US 2007/0178727 A1 Aug. 2, 2007

(30) Foreign Application Priority Data

Mar. 31, 2004 (JP) ............................. 2004-102948

(51) Int. Cl.
*G01R 31/02* (2006.01)

(52) U.S. Cl. .................... 324/754; 324/757; 324/758

(58) Field of Classification Search .................. None
See application file for complete search history.

(56) References Cited

U.S. PATENT DOCUMENTS

| 6,215,321 | B1 * | 4/2001 | Nakata ........................ 324/754 |
| 6,297,658 | B1 * | 10/2001 | Nakata et al. ................ 324/765 |
| 6,305,230 | B1 * | 10/2001 | Kasukabe et al. ............. 73/855 |
| 2002/0196046 | A1 * | 12/2002 | Johnson ....................... 324/765 |

FOREIGN PATENT DOCUMENTS

| JP | 7 231018 | 8/1995 |
| JP | 2002 246428 | 8/2002 |
| JP | 2003 31628 | 1/2003 |

* cited by examiner

*Primary Examiner*—Minh N Tang
(74) *Attorney, Agent, or Firm*—Oblon, Spivak, McClelland, Maier & Neustadt, P.C.

(57) ABSTRACT

A probe device including a circuit board for inspection having a great number of inspection electrodes, a probe card having a circuit board for connection having a great number of terminal electrodes and a contact member, an anisotropically conductive connector arranged between the circuit board for inspection and the circuit board for connection and electrically connecting the respective inspection electrodes to the respective terminal electrodes, and a parallelism adjusting mechanism for adjusting a parallelism of the circuit board for inspection and the circuit board for connection to the wafer. The parallelism adjusting mechanism includes a location-varying mechanism, which relatively displaces the circuit board for inspection or the circuit board for connection in the thickness-wise direction of the anisotropically conductive connector. A wafer inspection apparatus can include the probe device.

10 Claims, 8 Drawing Sheets

PROBE APPARATUS, WAFER INSPECTING APPARATUS PROVIDED WITH THE PROBE APPARATUS AND WAFER INSPECTING METHOD

TECHNICAL FIELD

The present invention relates to a wafer inspection apparatus and a wafer inspection method carried out in this wafer inspection apparatus, and a probe device suitable for use in this wafer inspection apparatus, and particularly to a wafer inspection apparatus and a wafer inspection method for collectively conducting a probe test as to a part or all of a great number of integrated circuits formed on a wafer, or a wafer inspection apparatus and a wafer inspection method for collectively conducting a burn-in test as to a part or all of a great number of integrated circuits formed on a wafer, and a probe device suitable for use in these wafer inspection apparatus.

BACKGROUND ART

In the production process of semiconductor integrated circuit devices, after a great number of integrated circuits are formed on a wafer, a probe test is generally conducted as to each of these integrated circuits. This wafer is then cut, thereby forming semiconductor chips. Such semiconductor chips are contained and sealed in respective proper packages. Each of the packaged semiconductor integrated circuit devices is further subjected to a burn-in test. In order to give a quality certification to a semiconductor integrated circuit device, it is extremely important to not only inspect electrical properties of the semiconductor integrated circuit device, but also inspect electrical properties of the semiconductor chip itself by the burn-in test. Besides, in recent years, there has been developed a mounting method that a semiconductor chip itself is used as an integrated circuit device to directly mount a circuit device composed of the semiconductor chip on, for example, a printed circuit board. Therefore, there is a demand for guaranteeing the quality of the semiconductor chip itself.

Since the semiconductor chip is minute, and its handling is inconvenient, however, it takes a long time to conduct the inspection of the circuit device composed of the semiconductor chip, and inspection cost thus becomes considerably high.

From such reasons, attention has been recently paid to a WLBI (Wafer Level Burn-in) test in which the electrical properties of a circuit device composed of a semiconductor chip are inspected in the state of a wafer.

On the other hand, in the probe test conducted on integrated circuits formed on a wafer, a method, in which a probe test is collectively performed on, for example, 16 or 32 integrated circuits among a great number of integrated circuits formed on a wafer, and the probe test is successively performed on other integrated circuits, is generally adopted.

However, in recent years, there has been a demand for collectively performing a probe test on, for example, 64 or 124 integrated circuits, or all integrated circuits among a great number of integrated circuits formed on a wafer for the purpose of improving inspection efficiency and reducing inspection cost.

FIG. 17 is a cross-sectional view schematically illustrating the construction of an exemplary conventional wafer inspection apparatus for conducting the WLBI test or probe test as to a wafer on which a great number of integrated circuits have been formed. Such wafer inspection apparatus are described in, for example, Patent Art. 1 and Patent Art. 2.

This wafer inspection apparatus has a circuit board 80 for inspection, on the front surface (lower surface in FIG. 17) of which a great number of inspection electrodes 81 have been formed, and a probe card 90 is arranged on the front surface of the circuit board 80 for inspection through a connector 85. This probe card 90 is constructed by a circuit board 91 for connection and a contact member 95 provided on the front surface (lower surface in FIG. 17) of the circuit board 91 for connection and having a great number of contacts (not illustrated) brought into contact with electrodes (not illustrated) to be inspected of integrated circuits in a wafer W that is an object of inspection. A wafer tray 96 which also serves as a heating plate, on which the wafer W that is the object of inspection is mounted, is arranged under the contact member 95.

Here, as the contact member 95, may be used that composed of an anisotropically conductive sheet, in which the contacts are composed of a plurality of conductive parts for connection each extending in a thickness-wise direction of the sheet have been mutually insulated by an insulating part, that composed of a sheet-like connector, in which contacts each composed of a metallic body and extending through an insulating sheet in a thickness-wise direction thereof have been arranged in the insulating sheet, that obtained by laminating an anisotropically conductive sheet and a sheet-like connector, or the like.

On a back surface of the circuit board 91 for connection in the probe card 90, a great number of terminal electrodes 92 are formed in accordance with a pattern corresponding to a pattern of the inspection electrodes 81 of the circuit board 80 for inspection, and the circuit board 91 for connection is arranged in such a manner that the terminal electrodes 92 are respectively opposed to the inspection electrodes 81 of the circuit board 80 for inspection by guide pins 93.

In the connector 85, a great number of connecting pins 86 called "pogo pins", which can be elastically compressed in a lengthwise direction thereof are arranged in accordance with the pattern corresponding to the pattern of the inspection electrodes 81 of the circuit board 80 for inspection. The connector 85 is arranged in a state that the connecting pins 86 have been respectively located between the inspection electrodes 81 of the circuit board 80 for inspection and the terminal electrodes 92 of the circuit board 91 for connection.

In this wafer inspection apparatus, the wafer W that is the object of inspection is mounted on the wafer tray 96, and the wafer tray 96 is moved upward by a suitable drive means (not illustrated), whereby the wafer W is brought into contact with the probe card 90. By being further pressurized upward from this state, each of the connecting pins 86 of the connector 85 is elastically compressed in a longitudinal direction thereof, whereby the respective inspection electrodes 81 of the circuit board 80 for inspection are electrically connected to the respective terminal electrodes 92 of the circuit board 91 for connection, and the respective contacts of the contact member 95 come into contact with the respective electrodes to be inspected of a part of the integrated circuits formed on the wafer W, thereby achieving necessary electrical connection. The wafer W is then heated to a predetermined temperature by the wafer tray 96 to perform necessary electrical inspection (WLBI test or probe test) as to the wafer W in this state.

Patent Art. 1: Japanese Patent Application Laid-Open No. 2000-147063;

Patent Art. 2: Japanese Patent Application Laid-Open No. 2000-323535

DISCLOSURE OF THE INVENTION

However, such a wafer inspection apparatus as shown in FIG. 17 involves such problems as described below. More specifically, in the wafer inspection apparatus of such construction, the respective construction members making up the wafer inspection apparatus actually have warpage, waviness or the like in themselves, and the wafer tray 96 has undulation, so that the wafer inspection apparatus is in a state having relatively great undulation to the wafer W.

Showing a specific example, the plane precision (the degree of a scatter of the height level in the plane) of the wafer mounting-surface in the wafer tray 96 is about ±20 µm, and the degree of warpage or waviness of base materials themselves respectively forming the wafer W, circuit board 80 for inspection and circuit board 91 for connection is about ±10 µm. In addition, when an anisotropically conductive sheet is used as the contact member 95, the degree of a scatter of thickness of the anisotropically conductive sheet itself is about ±10 µm when the thickness is 200 µm. When a laminate of an anisotropically conductive sheet and a sheet-like connector is used as the contact member 95, there is a scatter of thickness of the sheet-like connector itself in addition to the scatter of thickness of the anisotropically conductive sheet itself, and the degree thereof is about ±5 µm when the thickness is 80 µm.

Accordingly, the wafer inspection apparatus involves a problem that the mere movement of the wafer tray 96 upward to pressurize the wafer W makes it difficult to surely attain a good electrically connected state between the respective contacts in the contact member 95 and the electrodes to be inspected in the wafer W because, for example, the contact member 95 becomes a state coming into contact with the wafer W at only one side due to the undulation of the whole wafer inspection apparatus, and after all, intended electrical inspection cannot be stably conducted.

Since the connecting pins 86 in the wafer inspection apparatus of the above-described construction require to have a considerably long length, a distance of a signal transmission system becomes considerably long, so that a problem arises that the apparatus is difficult to be adapted to electrical inspection as to high functional integrated circuits to which high-speed processing is required.

The present invention has been made on the basis of the foregoing circumstances and has as its object the provision of a wafer inspection apparatus and a wafer inspection method, by which electrical inspection can be collectively performed as to a great number of electrodes to be inspected in a great number of integrated circuits formed on a wafer, a good electrically connected state can be surely achieved as to all the electrodes to be inspected, and moreover electrical inspection can be performed as to high functional integrated circuits, and a probe device suitable for use in this wafer inspection apparatus.

The probe device according to the present invention is used for conducting electrical inspection of a great number of integrated circuits formed on a wafer, and comprises a circuit board for inspection having a great number of inspection electrodes on a front surface thereof; a probe card having a circuit board for connection, on the back surface of which a plurality of terminal electrodes have been formed in accordance with a pattern corresponding to a pattern of the inspection electrodes of the circuit board for inspection, and a contact member, which is provided on a front surface of the circuit board for connection, and on which a great number of contacts brought into contact with respective electrodes to be inspected of the integrated circuits on the wafer, which is an object of inspection, are arranged, in which the respective terminal electrodes of the circuit board for connection are arranged so as to be opposed to the inspection electrodes of the circuit board for inspection; an anisotropically conductive connector, which is arranged between the circuit board for inspection and the circuit board for connection in the probe card, and electrically connects the respective inspection electrodes to the respective terminal electrodes by being pinched by the circuit board for inspection and the circuit board for connection; and a parallelism adjusting mechanism for adjusting a parallelism of the circuit board for inspection to the wafer and a parallelism of the circuit board for connection to the wafer, wherein the parallelism adjusting mechanism is equipped with a location-varying mechanism, which relatively displaces the circuit board for inspection or the circuit board for connection in a thickness-wise direction of the anisotropically conductive connector.

In the probe device according to the present invention, it may be preferable that the parallelism adjusting mechanism be equipped with a plurality of location-varying mechanisms, and each of the location-varying mechanisms is so constructed that the quantity of displacement of the circuit board for inspection or the circuit board for connection can be set independently of each other.

The probe device according to the present invention may also preferably so constructed that spacers for regulating the deformation quantity of the anisotropically conductive connector are provided between the circuit board for inspection and the circuit board for connection in the probe card. In this case, the overall thickness of the spacer may preferably be at least 50% of the overall thickness of the anisotropically conductive connector.

The probe device according to the present invention may also be so constructed that the anisotropically conductive connector is composed of a frame plate, in which a plurality of anisotropically conductive film-arranging holes each extending in a thickness-wise direction of the frame plate have been formed corresponding to electrode regions, in which electrodes intended to be connected in the circuit board for connection and the circuit board for inspection have been arranged, and a plurality of elastic anisotropically conductive films arranged in the respective anisotropically conductive film-arranging holes in this frame plate and each supported by the peripheral edge of the anisotropically conductive film-arranging hole, and that the spacers are arranged on both sides of the frame plate in the anisotropically conductive connector, and the spacers are each in the form of a frame, in which openings are formed in regions corresponding to the regions where the elastic anisotropically conductive films in the anisotropically conductive connector have been formed, and have finely projected portions each composed of an elastic member on at least contact surfaces with the circuit board for inspection and contact surfaces with the circuit board for connection.

In the spacers of such constitution, it may be preferable that the total thickness of the thickness of the spacers including the finely projected portions and the thickness of the frame plate in the anisotropically conductive connector be at least 90% of the overall thickness of the anisotropically conductive connector.

Further, in the probe device according to the present invention, the contact member making up the probe card may preferably be formed by that equipped with an anisotropically conductive sheet, in which a plurality of conductive parts for connection each extending in a thickness-wise direction of the sheet are insulated from each other by an insulating part.

As such a contact member, may preferably be used that constructed by an anisotropically conductive sheet, in which a plurality of conductive parts for connection each extending in a thickness-wise direction of the sheet are insulated from each other by an insulating part, or an anisotropically conductive connector, in which the anisotropically conductive sheet is supported by a frame plate, and a sheet-like connector composed of an insulating sheet arranged on a front surface of the anisotropically conductive sheet or the anisotropically conductive connector and a plurality electrode structures each extending through the insulating sheet in the thickness-wise direction thereof and arranged in accordance with a pattern corresponding to a pattern of electrodes to be inspected.

The wafer inspection apparatus according to the present invention is that for conducting electrical inspection of a great number of integrated circuits formed on a wafer and comprises the above-described probe device.

The wafer inspection method according to the present invention comprises relatively displacing a circuit board for inspection or a circuit board for connection by location-varying mechanisms making up a parallelism adjusting mechanism to temporarily fix the three parties of the circuit board for inspection, an anisotropically conductive connector and the circuit board for connection in a state that the anisotropically conductive connector has been pinched by the circuit board for inspection and the circuit board for connection, thereby electrically connecting inspection electrodes in the circuit board for inspection to their corresponding terminal electrodes in the circuit board for connection through conductive parts for connection in the anisotropically conductive connector, further pressurizing a probe device from this state to measure a parallelism of the circuit board for inspection to a wafer and a parallelism of the circuit board for connection to the wafer in a state that a contact member in a probe card is brought into contact with the wafer that is an object of inspection, setting a correction quantity of the quantity of displacement by the location-varying mechanism on the basis of results obtained, conducting an inspection initial state-setting operation for adjusting the quantity of displacement on the basis of the correction quantity, thereby adjusting a parallelism of the circuit board for inspection to the wafer and a parallelism of the circuit board for connection to the wafer, and bringing the whole probe device into contact with the wafer in a state that displacement of the circuit board for inspection or the circuit board for connection in a direction that a clearance between the circuit board for inspection and the circuit board for connection becomes great has been prohibited, thereby conducting electrical inspection.

In the wafer inspection method according to the present invention, the parallelism adjusting mechanism may be equipped with a plurality of location-varying mechanisms, electric resistance values of the respective conductive parts for connection in the anisotropically conductive connector are measured in a state that the contact member in the probe card is brought into contact with the wafer that is an object of inspection, and the correction quantity in the quantity of displacement by the respective location-varying mechanisms is set in such a manner that the distribution of the resultant electric resistance values becomes an even state.

In the wafer inspection method according to the present invention, an inspection initial state may preferably be set in such manner that the respective electrical resistance values of the conductive parts for connection in the anisotropically conductive connector are at most $0.1\Omega$, and a load per one conductive part for connection in the anisotropically conductive connector is 0.01 to 0.4 N.

According to the probe device of the present invention, upon setting the inspection initial state that the three parties of the circuit board for inspection, the anisotropically conductive connector and the probe card are fixed in a state that the anisotropically conductive connector is pinched by the circuit board for inspection and the circuit board for connection, the undulation of the whole wafer inspection apparatus is adjusted by the parallelism adjusting mechanism to set the inspection initial state in a state that the three parties of the circuit board for inspection, the probe card and the wafer that is an object of inspection have an extremely high parallelism, so that displacement of the circuit board for inspection or the circuit board for connection in a direction that a clearance between the circuit board for inspection and the circuit board for connection becomes great is prohibited by the location-varying mechanism, and the respective contacts in the contact member and the respective electrodes to be inspected formed on the wafer are electrically connected while retaining the high parallelism to the wafer over the whole probe device. As a result, a necessary electrically connected state can be stably attained under a small load.

When the contact member in the probe card is constructed by that equipped with the anisotropically conductive sheet, in which a plurality of conductive parts for connection each extending in the thickness-wise direction thereof are mutually insulated by an insulating part, irregularities-absorbing property by the anisotropically conductive connector is basically obtained, and moreover the irregularities-absorbing property of the anisotropically conductive sheet itself in the contact member is achieved by being pressurized while retaining the high parallelism to the wafer over the whole probe device in a state that the irregularities-absorbing property is kept as much as possible, so that a good electrically connected state can be stably attained with higher certainty under a small load.

According to the wafer inspection apparatus of the present invention, since it is equipped with the probe device described-above, a good electrically connected sate can be stably attained between respective electrodes to be inspected formed on the wafer and respective contacts of the contact member under a small load. Accordingly, the intended electrical inspection can be surely conducted with high reliability.

According to the wafer inspection method of the present invention, since respective electrodes to be inspected formed on the wafer and respective contacts of the contact member are electrically connected in a state that the undulation of the whole wafer inspection apparatus is corrected by the parallelism adjusting mechanism, the intended electrical inspection can be surely conducted with high reliability.

DESCRIPTION OF CHARACTERS

Figure 1:
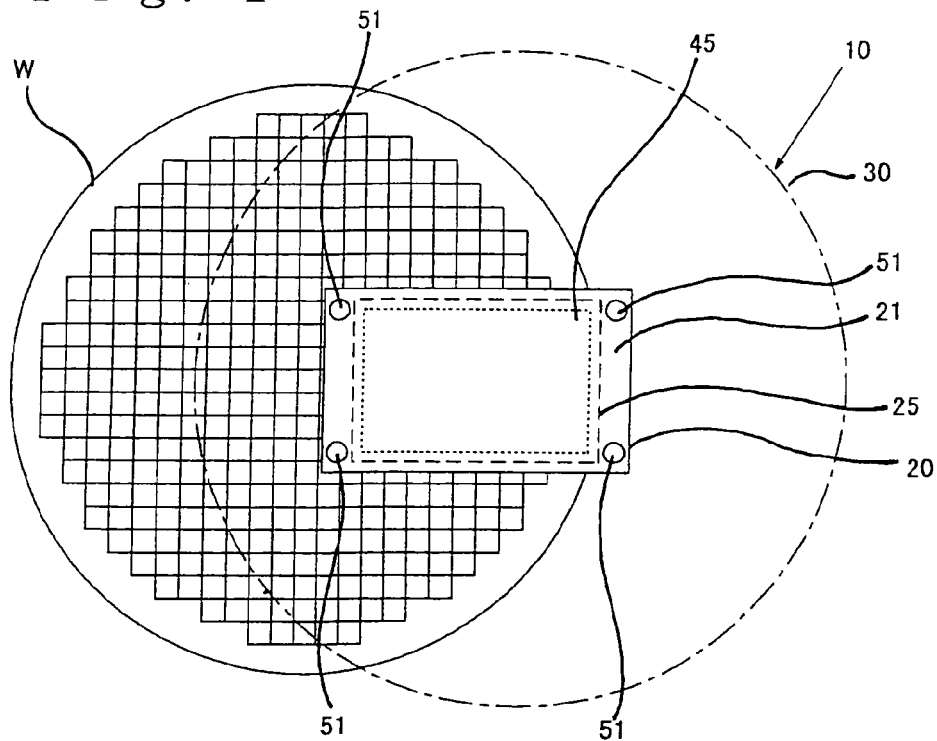
[FIG. 1] is a plan view schematically illustrating the constitution of a principal part of an exemplary wafer inspection apparatus according to the present invention together with a wafer that is an object of inspection.

10 Probe member
20 Anisotropically conductive connector for adjusting undulation
21 Frame plate
22 Anisotropically conductive film-arranging hole
23 Positioning hole
25 Elastic anisotropically conductive film
25A Molding material layer (intended form)
25B Molding material layer
26 Conductive part for connection
26A, 26B Projected part
26C Projected part
27 Insulating part
28A Finely projected portion
28B Finely projected portion
28C Wire
30 Circuit board for inspection
31 Inspection electrode
32 Recess
33 Through-hole
40 Probe card
41 Circuit board for connection
42 Terminal electrode
43 Recess
44 Through-hole
45 Anisotropically conductive connector for forming contact points
45A Anisotropically conductive connector
46 Elastic anisotropically conductive film
46A DLC film
47 Conductive part for connection
48 Insulating part
49 Frame plate
50 Parallelism adjusting mechanism
51 Location-varying mechanism
52 Bolt
53 Nut
55 Spacer
58 Wafer tray
60 Spacer
61 Finely projected portion
62 Plate part
63 Opening
64 Through-hole
65 Sheet-like connector
66 Metallic body (contact)
67 Insulating sheet
W Wafer
70 Top force
71 Ferromagnetic base plate
72 Ferromagnetic substance layer
73 Non-magnetic substance layer
74A Recess
75 Bottom force
76 Ferromagnetic base plate
77 Ferromagnetic substance layer
78 Non-magnetic substance layer
74B Recess
79A, 79B Spacer
K Opening
80 Circuit board for inspection
81 Inspection electrode
85 Connector
86 Connecting pin
90 Probe card
91 Circuit board for connection
92 Terminal electrode
93 Guide pin
95 Contact member
96 Wafer tray

BEST MODE FOR CARRYING OUT THE INVENTION

The present invention will hereinafter be described in detail.

Figure 2:
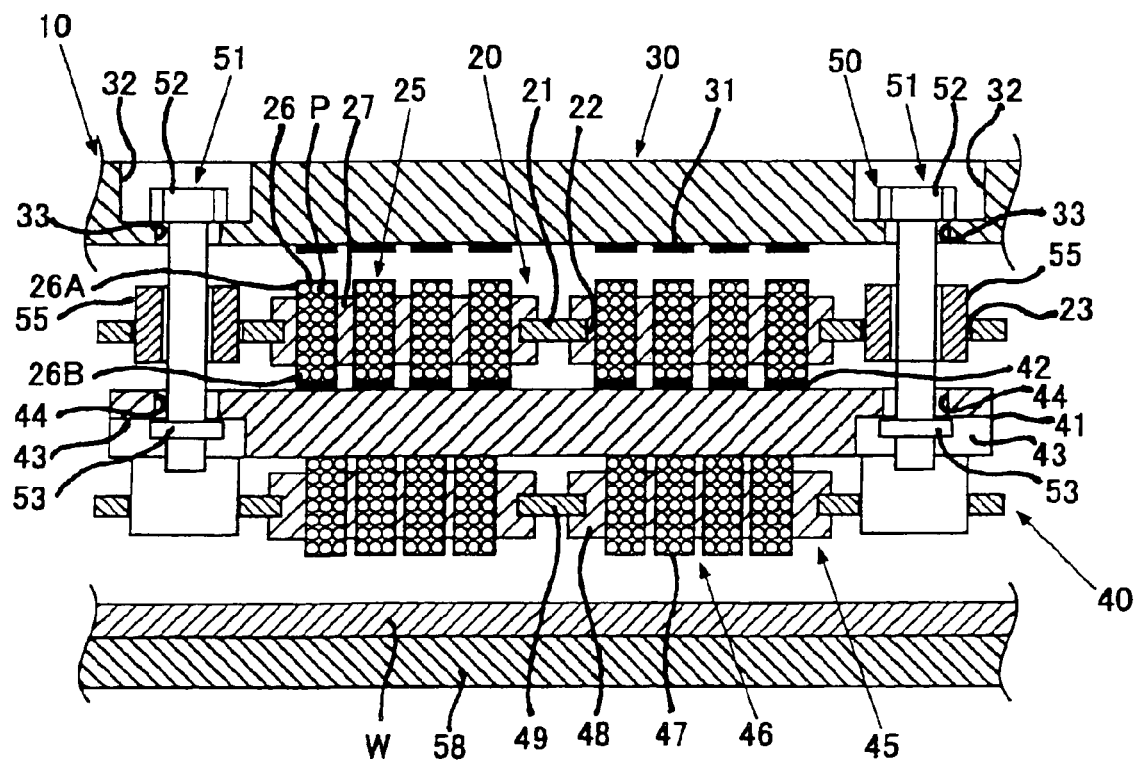
[FIG. 2] is a cross-sectional view illustrating, on an enlarged scale, the wafer inspection apparatus illustrated in FIG. 1.

FIG. 1 is a plan view schematically illustrating the construction of a principal part in an exemplary wafer inspection apparatus according to the present invention together with a wafer that is an object of inspection, and FIG. 2 is a cross-sectional view illustrating the wafer inspection apparatus illustrated in FIG. 1 on an enlarged scale.

This wafer inspection apparatus is equipped with a probe device 10 equipped with a circuit board 30 for inspection, on the front surface (lower surface in FIG. 2) of which a great number of inspection electrodes 31 have been formed, and a probe card 40 arranged on the front surface of the circuit board 30 for inspection through an anisotropically conductive connector 20, which will be described in detail subsequently, and a wafer tray 58 which also serves as a heating plate, on which a wafer W that is an object of inspection is mounted, is arranged under the probe card 40. The wafer tray 58 is in a state capable of being moved vertically by a suitable drive means (not illustrated).

The probe card 40 is constructed by a circuit board 41 for connection, on the back surface (upper surface in FIG. 2) of which a plurality of terminal electrodes 42 have been formed in accordance with a pattern corresponding to a pattern of the inspection electrode 31 of the circuit board 30 for inspection, and a contact member provided on a front surface (lower surface in FIG. 2) of this circuit board 41 for connection and having a great number of contacts (not illustrated) brought into contact with electrodes (not illustrated) to be inspected of integrated circuits on the wafer W, which is the object of inspection.

As examples of materials forming the circuit board 30 for inspection and the circuit board 41 for connection 41, may be mentioned glass, ceramic and epoxy resin.

The anisotropically conductive connector (hereinafter referred to as "anisotropically conductive connector for adjusting undulation") 20 arranged between the circuit board 30 for inspection and the circuit board 41 for connection in the probe card 40 has a frame plate 21, in which a plurality of anisotropically conductive film-arranging holes 22 each extending through in a thickness-wise direction thereof have been formed, elastic anisotropically conductive films 25 having conductivity in a thickness-wise direction of the film are arranged in the respective anisotropically conductive film-arranging holes 22 so as to close the anisotropically conductive film-arranging holes 22, and peripheries of the elastic anisotropically conductive films 25 are fixed to and supported by opening edges of the anisotropically conductive film-arranging holes 22. In addition, in the frame plate 21, are formed a plurality of positioning holes 23 for conducting positioning to the circuit board 30 for inspection and the probe card 40. In this embodiment, four positioning holes 23 are formed at the four corners of the rectangular frame plate 21.

Each of the elastic anisotropically conductive films 25 is formed by an elastic polymeric substance and constructed by a plurality of conductive parts 26 for connection arranged in accordance with a pattern corresponding to patterns of the electrodes intended to be connected, specifically, the inspection electrodes 31 in the circuit board 30 for inspection and the terminal electrodes 42 in the circuit board 41 for connection and each extending in the thickness-wise direction thereof, and an insulating part 27 mutually insulating these conductive parts 26 for connection.

In the conductive parts 26 for connection in the elastic anisotropically conductive film 25, are densely contained conductive particles P exhibiting magnetism in a state oriented to align in the thickness-wise direction thereof. On the other hand, conductive particles. P are not contained at all or scarcely contained in the insulating part 27.

In the illustrated embodiment, the conductive parts 26 for connection are formed so as to protrude from each of both surfaces of the insulating part 27.

The overall thickness of the elastic anisotropically conductive film 25 is preferably, for example, 100 to 3,000 µm, more preferably 150 to 2,500 µm, particularly preferably 200 to 2,000 µm. When the thickness of the elastic anisotropically conductive film 25 satisfies the above-described range, it comes to have sufficient irregularities-absorbing property necessary to adjust undulation in the whole wafer inspection apparatus. In addition, when the thickness is at least 100 µm, an elastic anisotropically conductive film 25 having sufficient strength can be surely obtained. On the other hand, when the thickness is at most 3,000 µm, conductive parts 26 for connection having necessary conductive property can be surely obtained.

The total projected height of the projected parts 26A, 26B in each of the conductive parts 26 for connection of the anisotropically conductive film 25 is preferably at least 20%, more preferably at least 25%, particularly preferably at least 30% of the thickness of the conductive part 26 for connection. When projected parts 26A, 26B having such a projected height are formed, the conductive parts 26 for connection are sufficiently compressed under a low pressure, so that good conductivity is surely achieved. In addition, the variable range (adjustable range) of a compression quantity upon conducting adjustment of undulation of the whole probe device 10 may be made great.

As described above, in the probe device 10 according to the present invention, both of the circuit board 30 for inspection and the probe card 40 are arranged through the anisotropically conductive connector 20 for adjusting undulation.

The respective inspection electrodes 31 in the circuit board 30 for inspection are electrically connected to the respective terminal electrodes 42 of the circuit board 41 for connection in the probe card 40 in a state that the anisotropically conductive connector 20 for adjusting undulation has been pinched by the circuit board 30 for inspection and the probe card 40. The anisotropically conductive connector 20 is fixed and used in this state.

In the probe device 10 according to the present invention, between the circuit board 30 for inspection and the probe card 40, a plurality (four in this embodiment) of spacers 55 for regulating a maximum deformation quantity of the elastic anisotropically conductive films 25 in the anisotropically conductive connector 20 for adjusting undulation are arranged in a state inserted through or fitted into respective positioning holes 23 of the frame plate 21 in the anisotropically conductive connector 20 for adjusting undulation, and moreover a parallelism adjusting mechanism 50 for adjusting undulation that the whole wafer inspection apparatus has is provided.

Each of the spacers 55 is formed of, for example, that having electrically insulating property and a cylindrical form, and a shaft of a bolt 52 as a location-varying mechanism 51 making up the parallelism adjusting mechanism 50, which will be described subsequently, is inserted into the interior space of the spacer 55. A positioning state is thereby achieved in such a manner that the respective terminal electrodes 42 of the circuit board 41 for connection are opposed to the respective inspection electrodes 31 of the circuit board 30 for inspection, and the respective conductive parts 26 for connection of the anisotropically conductive connector 20 for adjusting undulation are opposed to the respective electrodes intended to be connected.

The thickness of the spacer 55 is preferably at least 50%, more preferably 60 to 90%, for example, of the overall thickness of the anisotropically conductive connector 20 for adjusting undulation, whereby it is prevented that pinch pressure against the elastic anisotropically conductive film 25 becomes overload, thereby surely attaining necessary conductivity for the conductive parts 26 for connection in the elastic anisotropically conductive film 25.

The parallelism adjusting mechanism 50 is equipped with a plurality of location-varying mechanisms 51, which relatively displace the circuit board 30 for inspection or the probe card 40 in the thickness-wise direction (vertical direction in FIG. 2) of the anisotropically conductive connector 20 for adjusting undulation.

In this embodiment, as illustrated in FIG. 1, four location-varying mechanisms 51 are arranged at four corner positions in a plane of the probe device 10, and each of the location-varying mechanisms 51 is constructed by one in which the quantity of displacement (a clearance between the circuit board 30 for inspection and the circuit board 41 for connection) of the circuit board 30 for inspection or the circuit board 41 for connection can be adjusted independently of each other, for example, a pair of fastening members composed of a bolt 52 and a nut 53.

More specifically, the bolt 52 making up the location-varying mechanism 51 is arranged in a state that a head thereof is locked with an opening edge of a through-hole 33 in a recess 32 formed on a back surface of the circuit board 30 for inspection, a shaft thereof extends downward in a state fixed to or inserted through the through-hole 33 and passes through an interior space of the spacer 55 and a through-hole 44 in the circuit board 41 for connection, and a proximal portion of the shaft is exposed within a recess 43 formed in a front surface of the circuit board 41 for connection in the probe card 40. A nut 53 fitting to this bolt 52 is provided in a state screwed on the proximal portion of the bolt 52 and brought into contact with a bottom surface of the recess 43 in the circuit board 41 for connection, whereby the circuit board 30 for inspection and the probe card 40 (circuit board 41 for connection) are fixed in a state that movement (displacement) in the direction that the clearance between the circuit board 30 for inspection and the probe card 40 becomes great has been prohibited, and the fastening degree of the nut 53 is adjusted, whereby the circuit board 30 for inspection or the probe card 40 is relatively displaced in the thickness-wise direction of the anisotropically conductive connector 20 for adjusting undulation.

The pitch of the inspection electrodes 31 in the circuit board 30 for inspection is preferably, for example, 500 to 5,000 μm, more preferably 800 to 2,500 μm. By forming the inspection electrodes 31 at such a pitch, necessary electrical connection between such inspection electrodes 31 and the terminal electrodes 42 of the circuit board 41 for connection can be surely achieved, and moreover the inspection electrodes 31 can be arranged at a high density, so that a great number of inspection electrodes 31 according to the number of electrodes to be inspected of the wafer W that is the object of inspection can be formed.

Each of the contacts of the contact member making up the probe card 40 is electrically connected to its corresponding inspection electrode 31 of the circuit board 30 for inspection through a proper circuit (not illustrated) in the circuit board 41 for connection.

The contact member in this embodiment is formed by, for example, an anisotropically conductive connector (hereinafter referred to as "anisotropically conductive connector for forming contact points) 45, the basic construction of which is the same as the anisotropically conductive connector 20 for adjusting undulation. In this anisotropically conductive connector 45 for forming contact points, conductive parts 47 for connection in elastic anisotropically conductive films 46 are formed in accordance with a pattern corresponding to a pattern of electrodes to be inspected formed on the wafer W. For example, an arrangement pitch of the conductive parts 47 for connection is set smaller than that of the anisotropically conductive connector 20 for adjusting undulation. In FIG. 2, a reference numeral 48 denotes an insulating part, and 49 a frame plate.

The specific construction of the anisotropically conductive connector 20 for adjusting undulation and the anisotropically conductive connector 45 for forming contact points will hereinafter be described.

As a material for forming the frame plates 21, 49 in the anisotropically conductive connector 20 for adjusting undulation and the anisotropically conductive connector 45 for forming contact points, may be used various kinds of materials such as metallic materials, ceramic materials and resin materials. Specific examples thereof include metallic materials such as metals such as iron, copper, nickel, chromium, cobalt, magnesium, manganese, molybdenum, indium, lead, palladium, titanium, tungsten, aluminum, gold, platinum and silver, and alloys or alloy steels composed of a combination of at least two of these metals; ceramic materials such as silicon nitride, silicon carbide and alumina; and resin materials such as aramid nonwoven fabric-reinforced epoxy resins, aramid nonwoven fabric-reinforced polyimide resins, aramid nonwoven fabric-reinforced bismaleimide-triazine resins and aramide resins.

It is also preferable to use a material having a coefficient of linear thermal expansion equivalent or close to that of a material forming the circuit board 30 for inspection and the circuit board 41 for connection as a material forming the frame plate 21 in the anisotropically conductive connector 20 for adjusting undulation. When the circuit board 30 for inspection and the circuit board 41 for connection are formed by different materials from each other, it is preferable to use a material having a coefficient of linear thermal expansion equivalent or close to an average coefficient of linear thermal expansion of both of a material forming the circuit board 30 for inspection and a material forming the circuit board 41 for connection.

Specifically, as the material forming the frame plate 21, it is preferable to use that having a coefficient of linear thermal expansion of at most $5 \times 10^{-4}$/K. When the circuit board 30 for inspection and the circuit board 41 for connection are composed of, for example, a glass substrate, it is preferable to use that having a coefficient of linear thermal expansion of $3 \times 10^{-6}$ to $10 \times 10^{-6}$/K. Alternatively, when the circuit board 30 for inspection and the circuit board 41 for connection are composed of an organic substrate such as a glass-epoxy substrate, it is preferable to use that having a coefficient of linear thermal expansion of $6 \times 10^{-6}$ to $20 \times 10^{-6}$/K. Specific examples thereof include the same material as the material forming the circuit board 30 for inspection and the circuit board 41 for connection, metallic materials such as iron-nickel alloys such as stainless steel, and copper alloys such as phosphor bronze, and resin materials such as polyimide resins and liquid crystal polymer resins.

On the other hand, it is preferable to use a material having a coefficient of linear thermal expansion equivalent or close to that of a material forming a wafer, which is an object of inspection, as a material forming the frame plate 49 in the anisotropically conductive connector 45 for forming contact points. Specifically, when the material forming the wafer is silicon, it is preferable to use that having a coefficient of linear thermal expansion of at most $1.5 \times 10^{-4}$/K, particularly, $3 \times 10^{-6}$ to $8 \times 10^{-6}$/K. Specific examples thereof include metallic materials such as invar alloys such as invar, Elinvar alloys such as Elinvar, superinvar, covar, and 42 alloy; and resin material such as aramid nonwoven fabric-reinforced organic resin materials and aramid resins.

No particular limitation is imposed on the thickness of the frame plates 21, 49 so far as their forms are retained, and the elastic anisotropically conductive films 25, 46 can be held. However, the thickness is, for example, 30 to 1,000 μm, preferably 50 to 250 μm.

The elastic polymeric substance forming the elastic anisotropically conductive films 25, 46 is preferably a heat-resistant polymeric substance having a crosslinked structure. As a curable polymeric substance-forming material usable for obtaining the crosslinked polymeric substance, may be used various materials. Specific examples thereof include conjugated diene rubbers such as silicone rubber, polybutadiene rubber, natural rubber, polyisoprene rubber, styrene-butadiene copolymer rubber and acrylonitrile-butadiene copolymer rubber and hydrogenated products thereof; block copolymer rubbers such as styrene-butadiene-diene block terpolymer rubber and styrene-isoprene block copolymers and hydrogenated products thereof; and besides chloroprene, urethane rubber, polyester rubber, epichlorohydrin rubber, ethylene-propylene copolymer rubber, ethylene-propylene-diene terpolymer rubber and soft liquid epoxy rubber. Among these, silicone rubber is preferred from the viewpoints of molding and processing ability and electrical properties.

The silicone rubber is preferably that obtained by crosslinking or condensing liquid silicone rubber. The liquid silicone rubber may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 from the viewpoint of the heat resistance of the resulting elastic anisotropically conductive films 25, 46.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and then fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosiloxane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting elastic anisotropically conductive films 25, 46.

In the present invention, any one of the above-described vinyl group-containing dimethyl polysiloxane and hydroxyl group-containing dimethyl polysiloxane may be used, or both may be used in combination.

When the anisotropically conductive connectors are used in a probe test or burn-in test as to integrated circuits formed on a wafer, a substance, which is a cured product (hereinafter referred to as "cured silicon rubber") of the addition type liquid silicone rubber, and has a compression set of at most 10%, more preferably at most 8%, still more preferably at most 6% at 150° C., is preferably used as the elastic polymeric substance. If the compression set exceeds 10%, the conductive parts 26, 47 for connection tend to cause permanent set when the resulting anisotropically conductive connectors are used repeatedly many a time or used repeatedly under a high-temperature environment, whereby chains of the conductive particles P in the conductive parts 26, 47 for connection are disordered. As a result, it is difficult to retain necessary conductivity.

In the present invention, the compression set of the cured silicone rubber can be measured by a method in accordance with JIS K 6249.

The cured silicone rubber forming the anisotropically conductive films 25, 46 preferably has a durometer A hardness of 10 to 60, more preferably 15 to 55, particularly preferably 20 to 50 at 23° C.

If the durometer A hardness is lower than 10, the insulating parts 27, 48 for mutually insulating the conductive parts 26, 47 for connection are easily over-distorted when pressurized, and it may be difficult in some cases to retain necessary insulating property between the conductive parts 26 for connection or the conductive parts 47 for connection. In addition, the amount of an uncured component in the cured silicone rubber becomes great, and the uncured component of the cured silicone rubber may adhere to the inspection electrodes 31 of the circuit board 30 for inspection and the terminal electrodes 42 of the circuit board 41 for connection in some cases when pressurized, whereby an adverse influence may be given. If the durometer A hardness exceeds 60 on the other hand, pressurizing force by a considerably heavy load is required for giving proper deformation to the conductive parts 26, 47 for connection, so that, for example, the wafer that is an object of inspection tends to cause deformation or breakage.

Further, when the anisotropically conductive connectors are used in a burn-in test, the cured silicone rubber preferably has a durometer A hardness of 25 to 40 at 23° C. If that having a durometer A hardness outside the above range is used as the cured silicone rubber, the conductive parts 26, 47 for connection tend to cause permanent set when the resulting anisotropically conductive connectors are used repeatedly in the burn-in test, whereby chains of the conductive particles P in the conductive parts 26, 47 are disordered. As a result, it may be difficult in some cases to retain the necessary conductivity.

In the present invention, the durometer A hardness of the cured silicone rubber can be measured by a method in accordance with JIS K 6249.

Further, the cured silicone rubber forming the anisotropically conductive films 25, 46 preferably have tear strength of at least 8 kN/m, more preferably at least 10 kN/m, still more preferably at least 15 kN/m, particularly preferably at least 20 kN/m at 23° C. If the tear strength is lower than 8 kN/m, the resulting anisotropically conductive films 25, 46 tend to deteriorate durability when they are distorted in excess.

In the present invention, the tear strength of the cured silicone rubber can be measured by a method in accordance with JIS K 6249.

Addition type liquid silicone rubber is that cured by a reaction of a vinyl group with an Si—H bond, and any of a one-pack type (one-component type) composed of polysiloxane having both vinyl group and Si—H bond and a two-pack type (two-component type) composed of a polysiloxane having a vinyl group and a polysiloxane having an Si—H bond may be used. However, addition type liquid silicone rubber of the two-pack type is preferably used.

As the addition type liquid silicone rubber, is preferably used that having a viscosity of 100 to 1,250 Pa·s, more preferably 150 to 800 Pa·s, particularly preferably 250 to 500 Pa·s at 23° C. If this viscosity is lower than 100 Pa·s, precipitation of conductive particles in such addition type liquid silicone rubber is easy to occur in a molding material for obtaining the anisotropically conductive films, which will be described subsequently, so that good storage stability is not achieved. In addition, the conductive particles are not oriented so as to align in a thickness-wise direction of the molding material layer when a parallel magnetic field is applied to the molding material layer, so that it may be difficult in some cases to form chains of the conductive particles in an even state. If this viscosity exceeds 1,250 Pa·s on the other hand, the viscosity of the resulting molding material becomes too high, so that it may be hard in some cases to form the molding material layer in the mold. In addition, the conductive particles are not sufficiently moved even when a parallel magnetic field is applied to the molding material layer. Therefore, it may be difficult in some cases to orient the conductive particles so as to align in the thickness-wise direction.

A curing catalyst for curing the polymeric substance-forming material may be contained in the polymeric substance-forming material. As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyro-nitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphine and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by weight per 100 parts by weight of the polymeric substance-forming material.

Specific examples of conductive particles P making up the conductive parts 26, 47 for connection and exhibiting magnetism include particles of metals exhibiting magnetism, such as iron, nickel and cobalt, particles of alloys thereof and particles containing such a metal; particles obtained by using these particles as core particles and plating the core particles with a metal having good conductivity, such as gold, silver, palladium or rhodium; particles obtained by using particles of a non-magnetic metal, inorganic particles such as glass beads or polymer particles as core particles and plating the core particles with a conductive magnetic material such as nickel or cobalt; and particles obtained by coating the core particles with both conductive magnetic material and metal having good conductivity.

Among these, particles obtained by using nickel particles as core particles and plating them with a metal having good conductivity, such as gold or silver are preferably used.

No particular limitation is imposed on the means for coating the surfaces of the core particles with the conductive metal. However, the coating may be conducted by, for example, electroless plating.

When particles obtained by coating the surfaces of core particles with a conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to coat is preferably 2.5 to 50% by weight, more preferably 3 to 45% by weight, still more preferably 3.5 to 40% by weight, particularly preferably 5 to 30% by weight based on the core particles.

The particle diameter of the conductive particles P is preferably 1 to 500 μm, more preferably 2 to 400 μm, still more preferably 5 to 300 μm, particularly preferably 10 to 150 μm.

The particle diameter distribution (Dw/Dn) of the conductive particles P is preferably 1 to 10, more preferably 1 to 7, still more preferably 1 to 5, particularly preferably 1 to 4.

When conductive particle P satisfying such conditions are used, the resulting anisotropically conductive films 25, 46 become easy to deform under pressure, and sufficient electrical contact is achieved among the conductive particles P in the conductive parts 26, 47 for connection of the elastic anisotropically conductive films 25, 46.

No particular limitation is imposed on the form of the conductive particles P. However, they are preferably in the form of a sphere or star, or a mass of secondary particles obtained by aggregating these particles from the viewpoint of permitting easy dispersion of the conductive particles in the polymeric substance-forming material.

The water content in the conductive particles P is preferably at most 5%, more preferably at most 3%, still more preferably at most 2%, particularly preferably at most 1%. The use of conductive particles P satisfying such conditions prevents or inhibits occurrence of bubbles in the molding material layer when the molding material layer is subjected to a curing treatment.

Those obtained by treating surfaces of the conductive particles P with a coupling agent such as a silane coupling agent may be suitably used. By treating the surfaces of the conductive particles P with the coupling agent, the adhesion property of the conductive particles P to the elastic polymeric substance is improved, so that the resulting elastic anisotropically conductive films 25, 46 become high in durability in repeated use.

The amount of the coupling agent used is suitably selected within limits not affecting the conductivity of the conductive particles P. However, it is preferably such an amount that a coating rate (proportion of an area coated with the coupling agent to the surface area of the conductive core particles) of the coupling agent on the surfaces of the conductive particles P amounts to at least 5%, more preferably 7 to 100%, still more preferably 10 to 100%, particularly preferably 20 to 100%.

The proportion of the conductive particles P contained in the conductive parts 26, 47 for connection is preferably 10 to 60%, more preferably 15 to 50% in terms of volume fraction. If this proportion is lower than 10%, it may be impossible in some cases to form conductive parts 26, 47 for connection sufficiently low in electric resistance value. If the proportion exceeds 60% on the other hand, the resulting conductive parts 26, 47 for connection are liable to be brittle, so that elasticity required of the conductive parts 26, 47 for connection may not be achieved in some cases.

In the polymeric substance-forming material, may be contained a general inorganic filler such as silica powder, colloidal silica, aerogel silica or alumina as needed. By containing such an inorganic filler, the thixotropic property of the resulting molding material is ensured, the viscosity thereof becomes high, the dispersion stability of the conductive particles P is improved, and moreover the strength of the elastic anisotropically conductive films 25, 46 obtained by a curing treatment can be made high.

No particular limitation is imposed on the amount of such an inorganic filler used. However, the use in a too large amount is not preferred because the movement of the conductive particles P by a magnetic field is inhibited greatly in the production process, which will be described subsequently.

Such an anisotropically conductive connector 20 for adjusting undulation as described above may be produced in the following manner. The same also shall apply to the anisotropically conductive connector 45 for forming contact points.

A plurality of anisotropically conductive film-arranging holes 22 are first formed in a frame plate-forming material corresponding to electrode regions, in which electrodes intended to be connected in the circuit board 41 for connection and the circuit board 30 for inspection have been formed, and a plurality of positioning holes 23 are formed at predetermined positions in the frame plate-forming material, thereby producing a frame plate 21. As a means for forming the anisotropically conductive film-arranging holes 22 and the positioning holes 23, may be used, for example, an etching method or the like.

Figure 3:
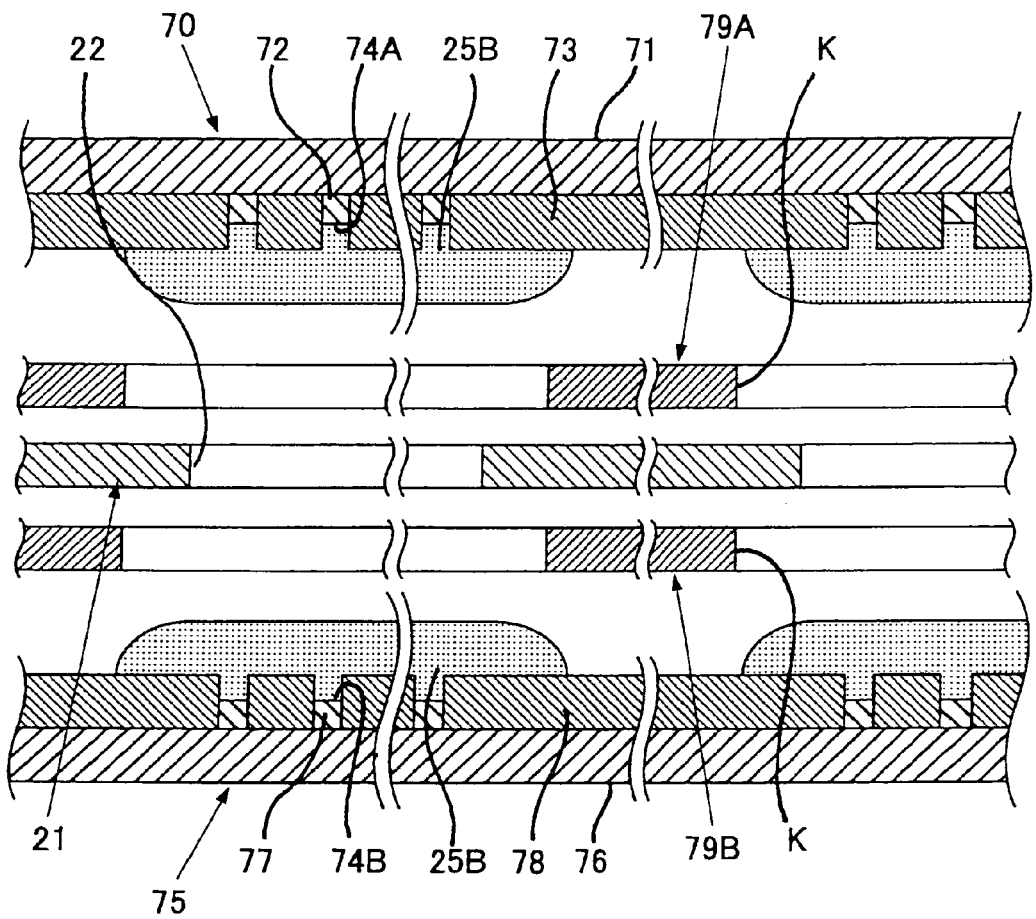
[FIG. 3] is a cross-sectional view illustrating a state that a frame plate is arranged between a top force and a bottom force of a mold for forming an elastic anisotropically conductive film through spacers.

A molding material with conductive particles P exhibiting magnetism dispersed in a polymeric substance-forming material, which will become an elastic polymeric substance by being cured, is then prepared. As illustrated in FIG. 3, a mold for molding elastic anisotropically conductive films is provided, and the molding material prepared is applied to the molding surfaces of a top force 70 and a bottom force 75 in this mold in accordance with a necessary pattern, namely, an arrangement pattern of elastic anisotropically conductive films 25 to be formed, thereby forming molding material layers 25B. As a method for applying the molding material to the molding surfaces of the top force 70 and bottom force 75, is preferably used a screen printing method. According to such a method, the molding material can be easily applied according to the necessary pattern, and a proper amount of the molding material can be applied.

The mold will be described specifically. In the top force 70, ferromagnetic substance layers 72 are formed on a lower surface of a ferromagnetic base plate 71 in accordance with a pattern antipodal to an arrangement pattern of conductive parts 26 for connection in all elastic anisotropically conductive films 25 to be molded, and non-magnetic substance layers 73 are formed at other portions than the ferromagnetic substance layers 72. The molding surface is formed by these ferromagnetic substance layers 72 and non-magnetic substance layers 73.

In the bottom force 75 on the other hand, ferromagnetic substance layers 77 are formed on an upper surface of a ferromagnetic base plate 76 in accordance with the same pattern as the arrangement pattern of the conductive parts 26 for connection in all the elastic anisotropically conductive films 25 to be molded, and non-magnetic substance layers 78 are formed at other portions than the ferromagnetic substance layers 77. The molding surface is formed by these ferromagnetic substance layers 77 and non-magnetic substance layers 78.

Recesses 74A, 74B are formed in the respective molding surfaces of the top force 70 and the bottom force 75 corresponding to respective projected parts 26A, 26B in the conductive parts 26 for connection of the elastic anisotropically conductive films 25 to be molded.

As a material for forming the ferromagnetic base plates 71, 76 in both top force 70 and bottom force 75, may be used a ferromagnetic metal such as iron, iron-nickel alloy, iron-cobalt alloy, nickel or cobalt. The ferromagnetic base plates 71, 76 preferably each have a thickness of 0.1 to 50 mm, and are preferably smooth in surfaces thereof and subjected to a chemical degreasing treatment and mechanical polishing treatment.

As a material for forming the ferromagnetic substance layers 72, 77 in both top force 70 and bottom force 75, may be used a ferromagnetic metal such as iron, iron-nickel alloy, iron-cobalt alloy, nickel or cobalt. The ferromagnetic material layers 72, 77 preferably each have a thickness of at least 10 µm. If this thickness is smaller than 10 µm, it is difficult to apply a magnetic field having sufficient intensity distribution to the molding material layers formed in the mold. As a result, it is difficult to gather the conductive particles P at a high density at portions to form conductive parts 26 for connection in the molding material layers, and so a sheet having good anisotropic conductivity may not be provided in some cases.

As a material for forming the non-magnetic substance layers 73, 78 in both top force 70 and bottom force 75, may be used a non-magnetic metal such as copper, a polymeric substance having heat resistance, or the like. However, a polymeric substance curable by radiation is preferably used in that the non-magnetic substance layers 73, 78 can be easily formed by a technique of photolithography. As a material thereof, may be used, for example, a photoresist such as an acrylic type dry film resist, epoxy type liquid resist or polyimide type liquid resist.

The thickness of the non-magnetic substance layers 73, 78 is preset according to the thickness of the ferromagnetic substance layers 72, 77 and the projected height of each of the conductive parts 26 for connection in the intended elastic anisotropically conductive films 25.

Figure 4:
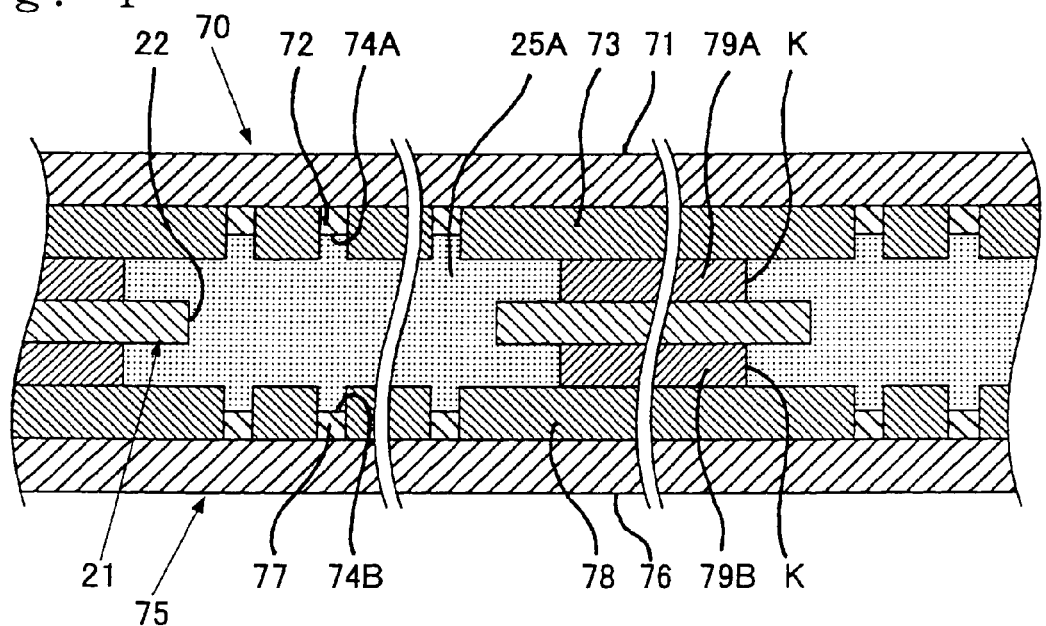
[FIG. 4] is a cross-sectional view illustrating a state that a molding material layer in an intended form has been formed between the top force and the bottom force of the mold.

The frame plate 21 is then arranged in alignment on the molding surface of the bottom force 75, on which the molding material layers 25B have been formed, through a spacer 79B, in which a plurality of openings K each having a form fitted to a plane form of the elastic anisotropically conductive films 25 to be formed have been formed, and on the frame plate 21, the top force 70, on which the molding material layers 25B have been formed, is arranged in alignment through a spacer 79A, in which a plurality of openings K each having a form fitted to a plane form of the elastic anisotropically conductive films 25 to be formed have been formed. Further, these top and bottom forces are superimposed on each other, whereby molding material layers 25A of the intended form (form of the elastic anisotropically conductive films 25 to be formed) are formed between the top force 70 and the bottom force 75 as illustrated in FIG. 4.

The spacers 79A, 79B are arranged between the frame plate 21, and the top force 70 and the bottom force 75, respectively, whereby the elastic anisotropically conductive films of the intended form can be formed, and adjacent elastic anisotropically conductive films are prevented from being connected to each other, so that a great number of elastic anisotropically conductive films independent of one another can be formed with certainty.

A pair of, for example, electromagnets are then arranged on an upper surface of the ferromagnetic base plate 71 in the top force 70 and a lower surface of the ferromagnetic base plate 76 in the bottom force 75, and the electromagnets are operated, whereby the conductive particles P dispersed in the molding material layers 25A are gathered at portions to become the conductive parts 26 for connection, which are located between the ferromagnetic substance layers 72 of the top force 70 and their corresponding ferromagnetic substance layers 77 of the bottom force 75, and oriented so as to align in the thickness-wise direction of the molding material layers. In this state, the molding material layers 25A are subjected to a curing treatment, whereby a plurality of elastic anisotropically conductive films 25, in each of which a plurality of conductive parts 26 for connection with the conductive particles contained in the elastic polymeric substance in a state oriented so as to align in the thickness-wise direction are arranged in a state mutually insulated by an insulating part 27 composed of the elastic polymeric substance, in which the conductive particles are not present at all or scarcely present, are formed in a state fixed to the respective opening edges of the elastic anisotropically conductive film-arranging holes 22 in the frame plate 21, thereby obtaining the anisotropically conductive connector 20 for adjusting undulation illustrated in FIG. 2.

Figure 5:
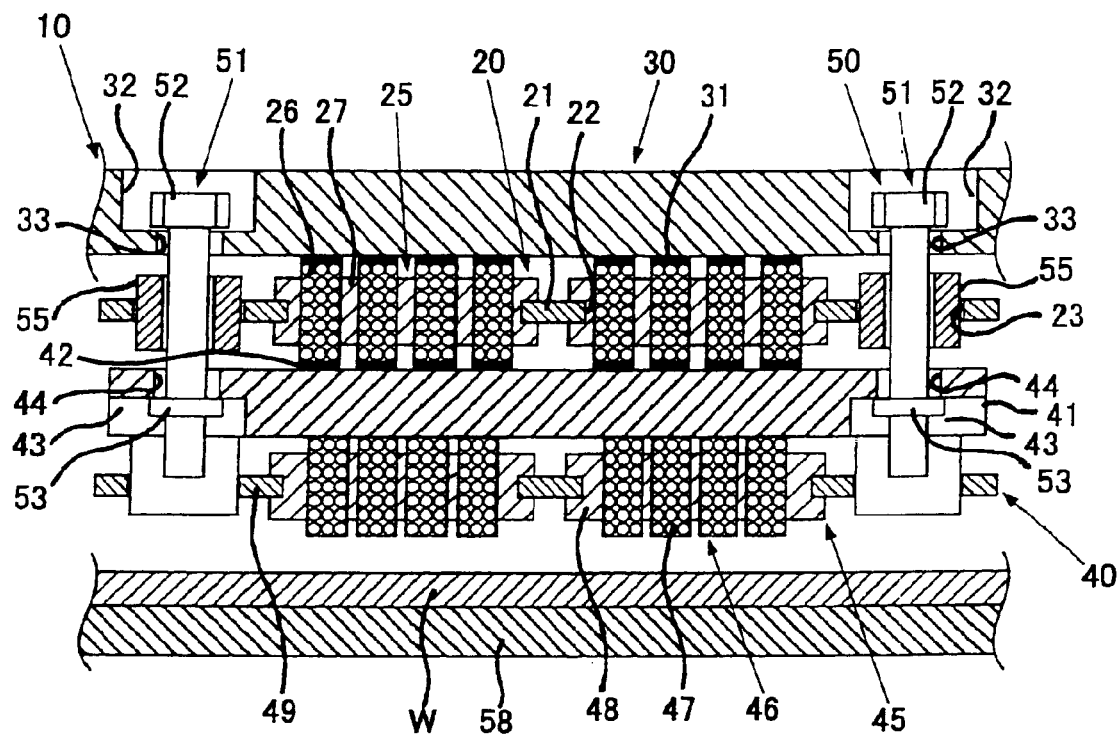
[FIG. 5] is a cross-sectional view illustrating a state that a circuit board for inspection and a circuit board for connection in the wafer inspection apparatus illustrated in FIGS. 1 and 2 have been electrically connected.

In the wafer inspection apparatus of the above-described construction, electrical inspection as to a wafer W is conducted in the following manner. More specifically, the nut 53 in each of the location-varying mechanisms 51 making up the parallelism adjusting mechanism 50 is first fastened in a predetermined fastening degree uniformly preset, whereby the three parties of the circuit board 30 for inspection, the anisotropically conductive connector 20 for adjusting undulation and the probe card 40 are temporarily fixed in a state that the elastic anisotropically conductive films 25 in the anisotropically conductive connector 20 for adjusting undulation have been pinched by the circuit board 30 for inspection and the circuit board 41 for connection and compressed in the thickness-wise direction as illustrated in FIG. 5, thereby electrically connecting the respective inspection electrodes 31 in the circuit board 30 for inspection to the respective terminal electrodes 42 in the circuit board 41 for connection making up the probe card 40 through the respective conductive parts 26 for connection in the anisotropically conductive connector 20 for adjusting undulation.

Figure 6:
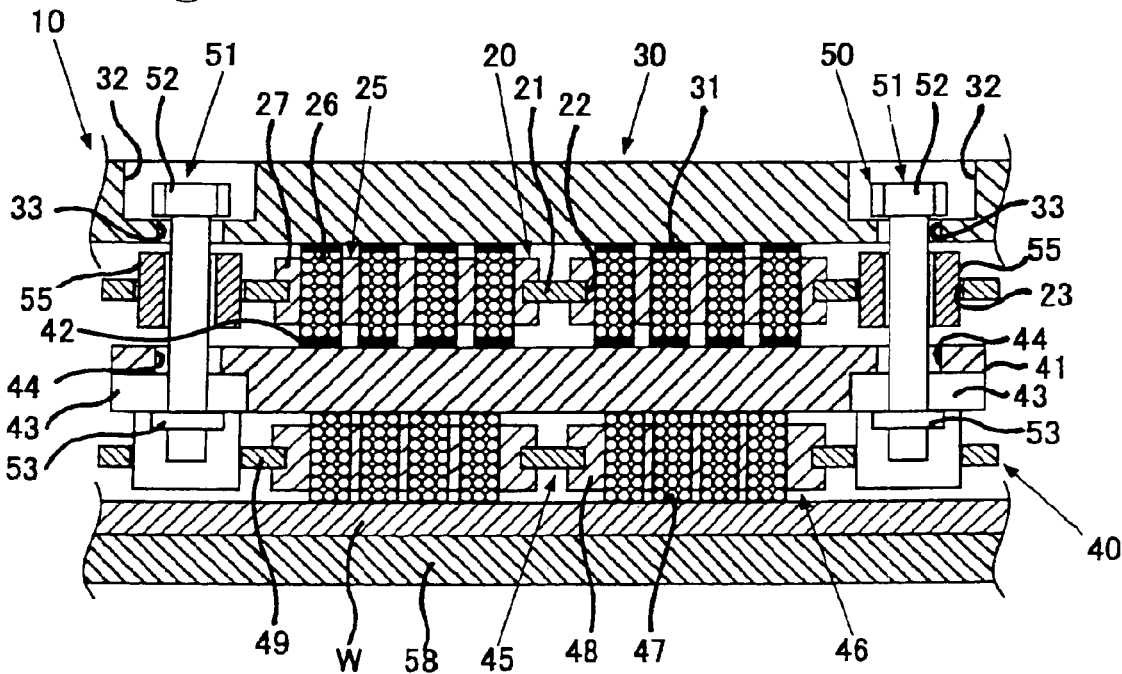
[FIG. 6] is a cross-sectional view illustrating a state that respective contacts in the circuit board for connection of the wafer inspection apparatus and respective electrodes to be inspected of a part of integrated circuits formed on a wafer have been electrically connected.

The wafer W, which is an object of inspection, is then mounted on the wafer tray 58, the wafer tray 58 is moved upward to bring the wafer W into contact with the probe card 40, the whole probe device is further pressurized upward from this state, thereby bringing the respective conductive parts 47 for connection in the anisotropically conductive connector 45 for forming contact points making up the probe card 40 into contact with respective electrodes to be inspected of a part of integrated circuits formed on the wafer W to electrically connect them to one another as illustrated in FIG. 6, and in this state, an inspection initial state-setting operation for adjusting the parallelism of the three parties of the circuit board 30 for inspection, the probe card 40 and the wafer W, i.e., a parallelism adjusting processing is conducted.

More specifically, the respective conductive parts 47 for connection in the anisotropically conductive connector 45 for forming contact points making up the probe card 40 are brought into contact with the respective electrodes to be inspected of a part of the integrated circuits formed on the wafer W, and the whole probe device is further pressurized upward in this state, thereby achieving electrical connection between the respective conductive parts 47 for connection in the anisotropically conductive connector 45 for forming contact points and the respective electrodes to be inspected in the wafer W. In this state, an electric resistance value of each of the conductive parts 26 for connection in the anisotropically conductive connector 20 for adjusting undulation is measured, the correction quantities of fastening degree of the nuts 53 in the respective location-varying mechanisms 51 are separately set as to the respective nuts 53 in such a manner that the distribution of the resultant electric resistance values become a substantially even state, and the fastening degrees of the respective nuts 53 are adjusted on the basis of these correction quantities. Here, the term "substantially even state" means a state that the electric resistance values in all the conductive parts 26 for connection consist with one another within a range of ±50 mΩ.

Such an inspection initial state-setting operation as described above is conducted repeatedly as needed, thereby setting the inspection initial state upon conducting the intended electrical inspection that the three parties of the circuit board 30 for inspection, the anisotropically conductive connector 20 for adjusting undulation and the probe card 40 are fixed in a state that the three parties of the circuit board 30 for inspection, the probe card 40 and the wafer W have had a high parallelism, and in a state that the elastic anisotropically conductive films 25 in the anisotropically conductive connector 20 for adjusting undulation have been pinched by the circuit board 30 for inspection and the circuit board 41 for connection and compressed in the thickness-wise direction, whereby a conduction state has been ensured, and moreover movement (displacement) of the circuit board 30 for inspection or the circuit board 41 for connection in a direction that a clearance between the circuit board 30 for inspection and the circuit board 41 for connection becomes great has been prohibited.

In this inspection initial state, it is preferable that the electric resistance values of all the conductive parts 26 for connection in the elastic anisotropically conductive films 25 in the anisotropically conductive connector 20 for adjusting undulation be, for example, 0.1Ω or lower, and that the pinch pressure against the elastic anisotropically conductive films 25 by the circuit board 30 for inspection and the circuit board 41 for connection be 0.01 to 0.4 N per one conductive part 26 for connection. If the value of this pinch pressure is too low, the electric resistance value of such a conductive part 26 for connection becomes high, so that it may be difficult in some cases to conduct the necessary electrical inspection. If this pinch pressure is too high on the other hand, the circuit board 30 for inspection and the circuit board 41 of connection are deformed, so that it may be difficult in some cases to achieve stable electrical connection.

After the inspection initial state of the wafer inspection apparatus is set, the wafer tray 58 is moved upward, whereby the respective conductive parts 47 for connection in the anisotropically conductive connector 45 for forming contact points are brought into contact with the respective electrodes to be inspected of a part of the integrated circuits formed on the wafer W. From this state, the whole probe device is further pressurized upward under a predetermined load, thereby achieving the necessary electrical connection.

The wafer W is then heated to a predetermined temperature by the wafer tray 58 to perform necessary electrical inspection (WLBI test or probe test) as to the wafer W in this state.

According to the wafer inspection apparatus of the above-described construction, it is equipped with the probe device 10 having the parallelism adjusting mechanism 50 for adjusting the undulation of the whole wafer inspection apparatus to the wafer W, and the nuts 53 in the respective location-varying mechanisms 51 making up the parallelism adjusting mechanism 50 are fastened independently of one another in respective fastening quantities controlled to proper degrees to adjust the parallelism of the whole wafer inspection apparatus, whereby the three parties of the circuit board 30 for inspection, the probe card 40 (circuit board 41 for connection) and the wafer W that is an object of inspection are held in a state having an extremely high parallelism.

More specifically, the nuts 53 in the respective location-varying mechanisms 51 are fastened in a fastening quantity evenly preset to a predetermined degree, thereby temporarily fixing the three parties of the circuit board 30 for inspection, the anisotropically conductive connector 20 for adjusting undulation and the probe card 40. The whole of the probe device 10 is further pressurized from the state brought into contact with the wafer W to electrically connect the respective conductive parts 47 for connection in the anisotropically conductive connector 45 for forming contact points to the respective electrodes to be inspected, which have been formed on the wafer W. The fastening degrees of the nuts 53 in the respective location-varying mechanisms 51 are separately adjusted in the respective correction quantities set in such a manner that the electric resistance values of all the conductive parts 26 for connection in the anisotropically conductive connector 20 for adjusting undulation become substantially even, whereby the undulation of the circuit board 30 for inspection and the probe card 40 is adjusted in relation with the surface of the wafer W, on which the electrodes to be inspected have been formed, in other words, in view of waviness, warpage and the like of the wafer W itself, so that the inspection initial state of the wafer inspection apparatus becomes a state that the three parties of the circuit board 30 for inspection, the probe card 40 (circuit board 41 for connection) and the wafer W that is an object of inspection have an extremely high parallelism, whereby the respective conductive parts 47 for connection in the anisotropically conductive connector 45 for forming contact points are electrically connected to the respective electrodes to be inspected in the wafer W while prohibiting displacement in a direction that a clearance between the circuit board 30 for inspection and the circuit board 41 for connection becomes great to retain the high parallelism to the wafer W over the whole of the probe device 10. As a result, the necessary electrically connected state can be stably attained under a small load. Accordingly, the intended electrical inspection as to the wafer W can be surely conducted with high reliability.

In addition, the contact member in the probe card 40 is constructed by the anisotropically conductive connector equipped with the elastic anisotropically conductive films (anisotropically conductive sheet), whereby the irregularities-absorbing property by the anisotropically conductive connector 20 for adjusting undulation by being pressurized from an inspection initial state to an inspection state in which an inspection load is applied is fundamentally achieved. In addition, the irregularities-absorbing property of the elastic anisotropically conductive films 46 themselves in the anisotropically conductive connector 45 for forming contact points is achieved by being pressurized while retaining the high parallelism to the wafer W over the whole of the probe device 10 in a state that the irregularities-absorbing property is kept as much as possible.

Figure 7:
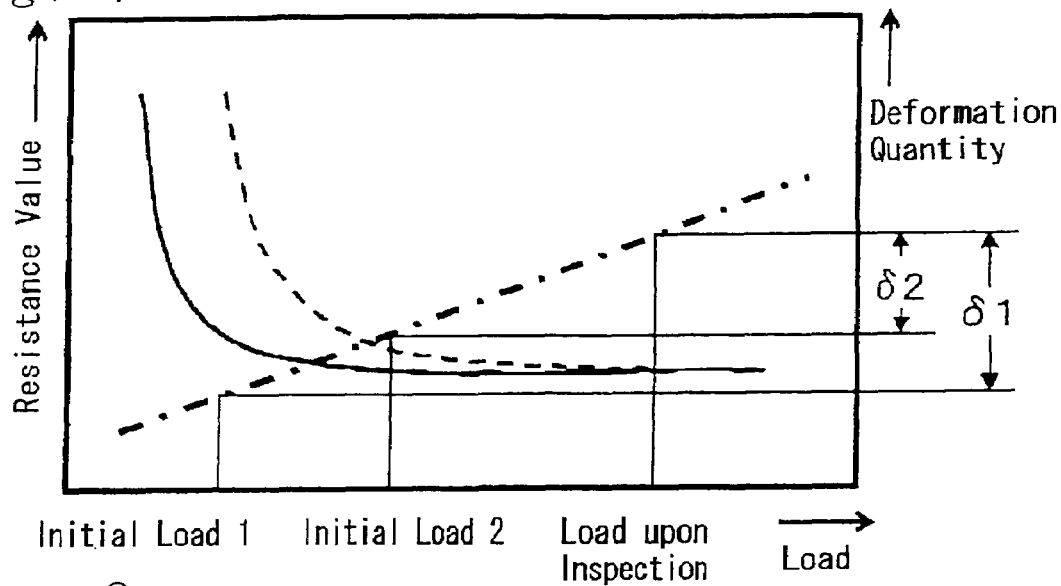
[FIG. 7] is a graph typically illustrating characteristic curves of an anisotropically conductive connector making up a contact member.

In other words, according to the wafer inspection apparatus of the above-described construction, the conductive parts for connection in the anisotropically conductive connector 45 for forming contact points are electrically connected to the electrodes to be inspected, which have been formed on the wafer W, in a state that the parallelism of the whole wafer inspection apparatus has be adjusted, whereby only a small load is required to reach a load in a state that all the conductive parts for connection have begun to be brought into contact with the respective electrodes to be inspected in the wafer W, i.e., an initial load 1, as illustrated in FIG. 7. When the parallelism of the whole of the wafer inspection apparatus is not adjusted, a great load is required to reach a load in a state that all the conductive parts for connection in the anisotropically conductive connector for forming contact points have begun to be brought into contact with the respective electrodes to be inspected in the wafer W, i.e., an initial load 2. Accordingly, the parallelism is adjusted, the deformation quantity (hereinafter referred to as "overdrive quantity") $\delta 1$ of the elastic anisotropically conductive films when pressurization is conducted from the initial load to a load upon inspection in an inspectable state can be made sufficiently great compared with an overdrive quantity $\delta 2$ when the parallelism is not adjusted. For example, in the elastic anisotropically conductive films 46 in the anisotropically conductive connector 45 for forming contact points, as shown in a load-deformation curve indicated by an alternate long and short dash line in FIG. 7, an overdrive quantity ($\delta 1/\delta 2$) greater by about 20 to 40% compared with the case where the parallelism is not adjusted is attained in the case where the overall thickness is 150 µm In addition, adjustment of the parallelism is conducted, whereby a state of stable resistance value (conduction property), i.e., a stable electrically connected state can be attained under a small load (see a load-resistance value curve indicated by a full line in FIG. 7). However, when no adjustment of the parallelism is conducted, a great load is required until the resistance value (conduction property) reaches a stable state (see a load-resistance value curve indicated by a broken line in FIG. 7).

Accordingly, in the whole of the probe device 10, an overdrive quantity (in this case, a deformation quantity of the elastic anisotropically conductive films 25 when pressurization is conducted from the initial load 1 to the load upon inspection in the inspectable state) by the anisotropically conductive connector 20 for adjusting undulation is attained, and moreover the overdrive quantity $\delta 1$ by the anisotropically conductive connector 45 for forming contact points is attained, so that a good electrically connected state can be stably attained with higher certainty under a small load, whereby the intended electrical inspection as to the wafer W can be surely conducted with high reliability. More specifically, when an anisotropically conductive connector 20 for adjusting undulation and an anisotropically conductive connector 45 for forming contact points each having an overall thickness of 500 μm are used, the total overdrive quantity related to the whole of the probe device 10 can be ensured by, for example, about 60 to 120 μm.

According to such a wafer inspection apparatus as described above, the following effects are further achieved.

(1) The anisotropically conductive connector 20 for adjusting undulation is such that the elastic anisotropically conductive films 25 are supported by the frame plate 21 composed of a metallic material, whereby the whole of the anisotropically conductive connector 20 for adjusting undulation is prevented from being greatly deformed when the frame plate 21 is held, thereby permitting easily conducting a positioning operation of the anisotropically conductive connector 20 for adjusting undulation to electrodes intended to be connected utilizing the location-varying mechanisms 51, specifically, using the bolts 52 as positioning pins.

In addition, with respect to the anisotropically conductive connector 45 for forming contact points, a positioning operation to electrodes intended to be connected can be easily conducted likewise.

(2) Since a clearance between the circuit board 30 for inspection and the circuit board 41 for connection is short, the size in a height-wise direction of the wafer inspection apparatus can be made small. Accordingly, the whole wafer inspection apparatus can be miniaturized.

(3) Since pressurizing force applied to the inspection electrodes 31 of the circuit board 30 for inspection is small, the inspection electrodes 31 are not damaged, and so the service life of the circuit board 30 for inspection is prevented from being shortened.

(4) The inspection electrodes 31 of the circuit board 30 for inspection are electrically connected through the specific anisotropically conductive connector 20 for adjusting undulation, whereby the inspection electrodes 31 can be arranged at a high density. Accordingly, a great number of inspection electrodes 31 can be formed, so that inspection as to a great number of electrodes to be inspected can be collectively performed.

(5) In the electrical connection through the anisotropically conductive connectors, contact resistance is low, and a stable connected state can be achieved, so that good electrical properties can be obtained.

(6) Since the inspection electrodes 31 of the circuit board 30 for inspection are electrically connected to the terminal electrodes 42 of the circuit board 41 for connection through the conductive parts 26 for connection in the anisotropically conductive connector 20 for adjusting undulation, a distance of a signal transmission system can be made short, so that the wafer inspection apparatus can be adapted to electrical inspection as to high functional integrated circuits of which high-speed processing is required.

(7) Since the frame plates 21, 49 in the anisotropically conductive connector 20 for adjusting undulation and the anisotropically conductive connector 45 for forming contact points are composed of a material having a low coefficient of linear thermal expansion, a good electrically connected state between the circuit board 30 for inspection and the circuit board 41 for connection can be stably retained even in changes of temperature environment, and moreover a good electrically connected state between the probe device 10 and the wafer W can be stably retain.

Although one embodiment of the present invention has been described above, the present invention is not limited to the above-described embodiment, and various changes or modifications may be added thereto.

Figure 8:
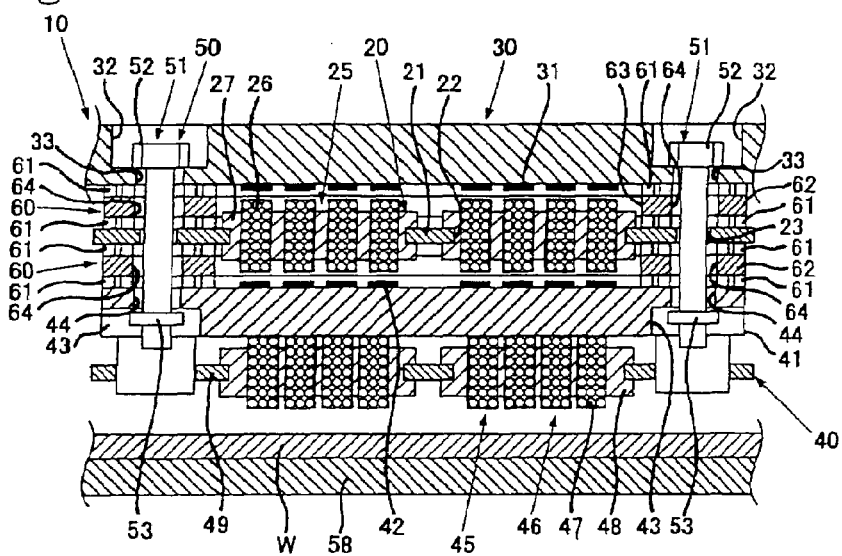
[FIG. 8] is a cross-sectional view illustrating, on an enlarged scale, the constitution of a principal part of an exemplary wafer inspection apparatus according to the present invention.

For example, in the wafer inspection apparatus according to the present invention, the probe device may be modified to the construction illustrated in FIG. 8.

This probe device will be described specifically. The probe device 10 making up this wafer inspection apparatus is so constructed that spacers 60 for regulating a maximum deformation quantity of the anisotropically conductive connector 20 for adjusting undulation have a rectangular frame-like form having opening 63 in regions corresponding to regions, in which the elastic anisotropically conductive films 25 of the anisotropically conductive connector 20 for adjusting undulation have been formed, and are arranged on both surfaces of the frame plate 21 in the anisotropically conductive connector 20 for adjusting undulation to support the anisotropically conductive connector 20 for adjusting undulation. The basic construction of this wafer inspection apparatus is the same as the wafer inspection apparatus illustrated in FIG. 2 except that the spacers different in structures from each other are used. For the sake of convenience, like numerals or characters are given to the same constructive members.

In the spacers 60, through-holes 64 each extending in a thickness-wise direction of the spacer are formed at positions corresponding to the positioning holes 23 of the anisotropically conductive connector 20 for adjusting undulation, and a bolt 52 making up each of location-varying mechanisms 51 is inserted into the through-hole 64 in each of the spacers 60 and the positioning hole 23 in the anisotropically conductive connector 20 for adjusting undulation, whereby the three parties of the circuit board 30 for inspection, the anisotropically conductive connector 20 for adjusting undulation and the probe card 40 are arranged in a state positioned in such a manner that the respective inspection electrodes 31 in the circuit board 30 for inspection are opposed to the respective terminal electrodes 42 in the circuit board 41 for connection, and the respective conductive parts 26 for connection in the anisotropically conductive connector 20 for adjusting undulation are opposed to the respective electrodes intended to be connected.

The spacers 60, 60 in this embodiment have a rectangular frame-like plate part 62 composed of, for example, a metal, and a plurality of columnar finely projected portions 61 composed of an elastic substance and formed on a surface of this plate part 62, which is brought into contact with the frame plate 21 of the anisotropically conductive connector 20 for adjusting undulation is brought into contact, and another surface with which the circuit board 30 for inspection or the circuit board 41 for connection.

The overall thickness of the two spacers 60, 60 including the frame plate 21 of the anisotropically conductive connector 20 for adjusting undulation is, for example, preferably at least 50%, more preferably 50 to 70% of the overall thickness of the anisotropically conductive connector 20 for adjusting undulation.

The total thickness of the thickness of the two spacers, 60 including the finely projected portions 61 and the thickness of the frame plate 21 of the anisotropically conductive connector 20 for adjusting undulation is preferably at least 90%, more preferably 90 to 95% of the overall thickness of the anisotropically conductive connector 20 for adjusting undulation.

By using the spacers 60 of such construction, it is prevented that pinch pressure against the elastic anisotropically conductive films 25 in the anisotropically conductive connector 20 for adjusting undulation becomes overload, whereby necessary conductivity for the conductive parts 26 for connection are surely attained, and moreover an expected undulation-correcting function by the finely projected portions 61 is surely attained.

Figure 9:
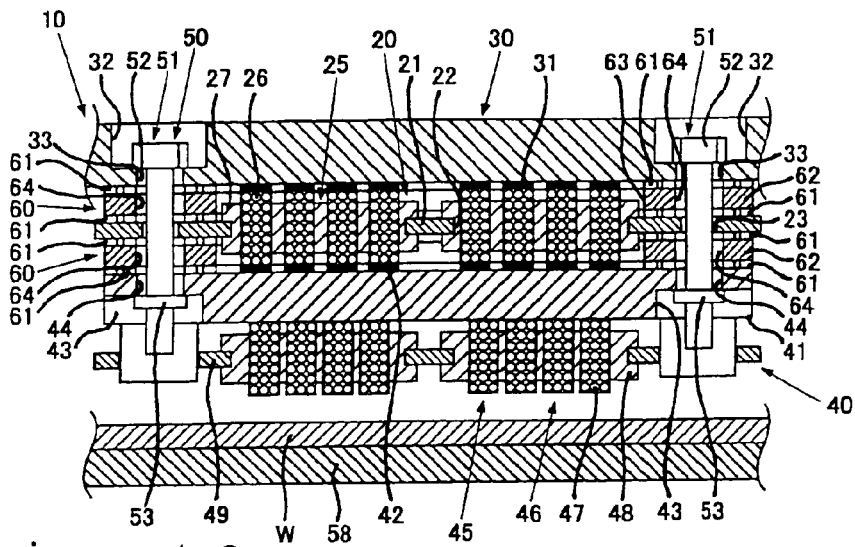
[FIG. 9] is a cross-sectional view illustrating a state that a circuit board for inspection and a circuit board for connection in the wafer inspection apparatus illustrated in FIG. 8 have been electrically connected.

In this wafer inspection apparatus, the intended electrical inspection as to the wafer W is performed in the same manner as in the wafer inspection apparatus illustrated in FIGS. 1 and 2. More specifically, the nut 53 in each of the location-varying mechanisms 51 making up the parallelism adjusting mechanism 50 is fastened in a predetermined fastening degree uniformly preset, whereby the three parties of the circuit board 30 for inspection, the anisotropically conductive connector 20 for adjusting undulation and the probe card 40 are temporarily fixed in a state that the elastic anisotropically conductive films 25 in the anisotropically conductive connector 20 for adjusting undulation have been pinched by the circuit board 30 for inspection and the circuit board 41 for connection and compressed in the thickness-wise direction, and moreover the respective finely projected portions 61 in the spacers 60 have been pinched and compressed in the thickness-wise direction as illustrated in FIG. 9, thereby electrically connecting the respective inspection electrodes 31 in the circuit board 30 for inspection to the respective terminal electrodes 42 in the circuit board 41 for connection through the respective conductive parts 26 for connection in the anisotropically conductive connector 20 for adjusting undulation.

Figure 10:
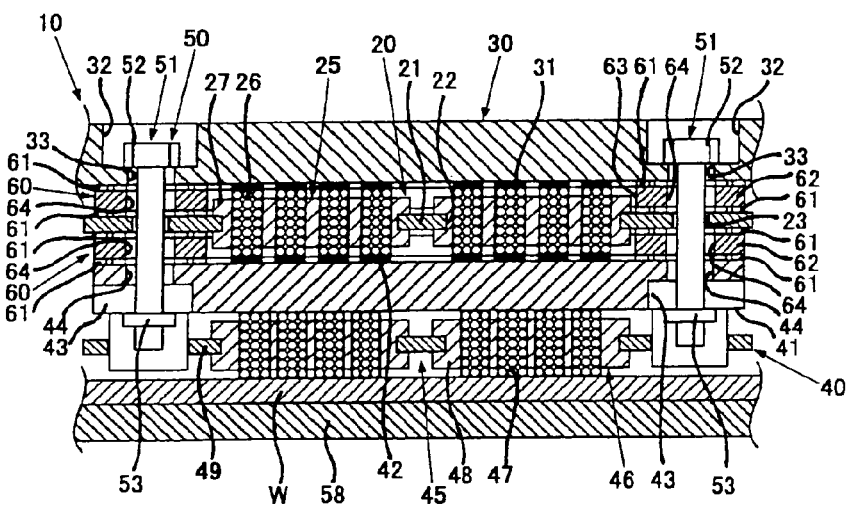
[FIG. 10] is a cross-sectional view illustrating a state that respective contacts in the circuit board for connection of the wafer inspection apparatus and respective electrodes to be inspected of a part of integrated circuits formed on the wafer have been electrically connected.

The wafer W, which is an object of inspection, is then mounted on the wafer tray 58, the wafer tray 58 is moved upward to bring the wafer W into contact with the probe card 40, the whole probe device is further pressurized upward from this state, thereby bringing the respective conductive parts 47 for connection in the anisotropically conductive connector 45 for forming contact points into contact with respective electrodes to be inspected of a part of integrated circuits formed on the wafer W as illustrated in FIG. 10, and from this state, the probe device is further pressurized upward, thereby creating a state that electrical connection has been achieved. In this state, an electric resistance value of each of the conductive parts 26 for connection in the anisotropically conductive connector 20 for adjusting undulation is measured, the correction quantities of fastening degree of the nuts 53 in the respective location-varying mechanisms 51 are separately set as to the respective nuts 53 in such a manner that the distribution of the resultant electric resistance values become a substantially even state, and the fastening degrees of the respective nuts 53 are adjusted on the basis of these correction quantities.

Such an inspection initial state-setting operation as described above is conducted repeatedly as needed, thereby setting the inspection initial state upon conducting the intended electrical inspection that the three parties of the circuit board 30 for inspection, the anisotropically conductive connector 20 for adjusting undulation and the probe card 40 are fixed in a state that the three parties of the circuit board 30 for inspection, the probe card 40 and the wafer W have had a high parallelism, and in a state that the elastic anisotropically conductive films 25 in the anisotropically conductive connector 20 for adjusting undulation have been pinched by the circuit board 30 for inspection and the circuit board 41 for connection, whereby a conduction state has been ensured, and moreover movement (displacement) of the circuit board 30 for inspection or the circuit board 41 for connection in a direction that a clearance between the circuit board 30 for inspection and the circuit board 41 for connection becomes great has been prohibited.

After the inspection initial state of the wafer inspection apparatus is set, the wafer tray 58 is moved upward by a proper drive means, whereby the respective conductive parts 47 for connection in the anisotropically conductive connector 45 for forming contact points are brought into contact with the respective electrodes to be inspected of a part of the integrated circuits formed on the wafer W. From this state, the whole probe device is further pressurized upward, thereby achieving the necessary electrical connection.

The wafer W is then heated to a predetermined temperature by the wafer tray 58 to perform necessary electrical inspection (WLBI test or probe test) as to the wafer W in this state.

According to the wafer inspection apparatus of the above-described construction, the same effects as those in the apparatus shown in FIGS. 1 and 2 are fundamentally brought about In addition, the undulation adjusting function by the finely projected portions 61 in the spacers 60 is achieved, so that a good electrically connected state can be attained with higher certainty under a small load, whereby the intended electrical inspection as to the wafer W can be surely conducted with high reliability.

In the wafer inspection apparatus of the above-described construction, it is not necessary to form the finely projected portions 61 on both surfaces of the spacer 60, and they may be formed on any one surface.

In the above-described embodiments, the location-varying mechanisms making up the parallelism adjusting mechanism in the present invention are not limited to pairs of fastening members composed of a bolt and a nut so far as the circuit board for inspection or the circuit board for connection can be relatively displaced in the thickness-wise direction of the anisotropically conductive connector, and moreover the displacement of the circuit board for inspection or the circuit board for connection in the direction that a clearance between the circuit board for inspection and the circuit board for connection becomes great can be prohibited in a state that the inspection electrodes in the circuit board for inspection have been electrically connected to the terminal electrodes in the circuit board for connection, and various kinds of mechanisms can be utilized.

Figure 11:
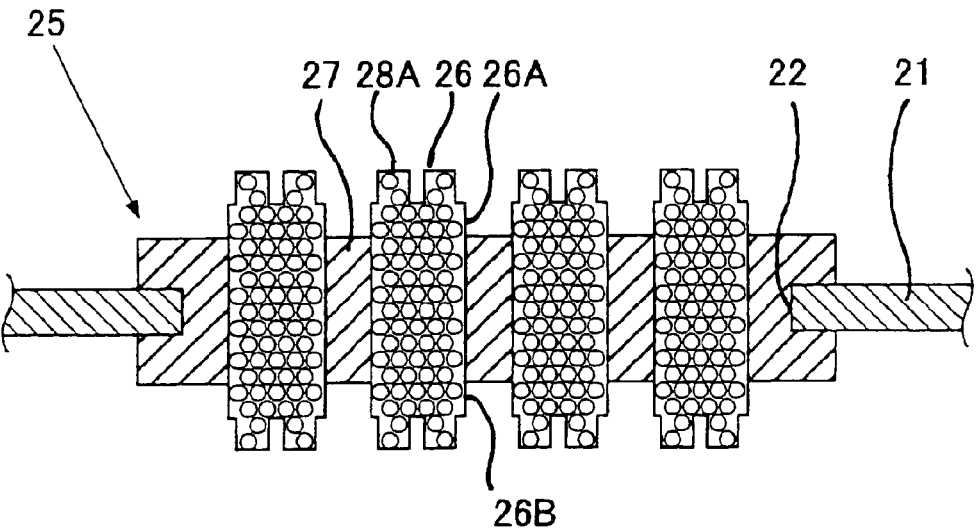
[FIG. 11] is a cross-sectional view illustrating the construction of another exemplary anisotropically conductive connector.

The anisotropically conductive connector for adjusting undulation, through which the respective inspection electrodes 31 in the circuit board 30 for inspection are electrically connected to the respective terminal electrodes 42 in the circuit board 41 for connection, may be so constructed that finely projected portions are formed on the conductive parts for connection in each of the elastic anisotropically conductive films 25 as illustrated in FIG. 11, for example.

More specifically, each of the conductive parts 26 in the elastic anisotropically conductive film 25 of this anisotropically conductive connector 20 for adjusting undulation is such that finely projected parts each having, for example, a plurality of columnar finely projected portions 28A are formed on both end surface thereof.

The projected height of each finely projected portion 28A is, for example, 5 to 10% of the overall thickness of the anisotropically conductive connector 20 for adjusting undulation.

Such finely projected portions 28A can be obtained by using a mold for molding elastic anisotropically conductive films, which has molding surfaces, in which recesses of the intended form for forming finely projected portions have been formed.

Figure 12:
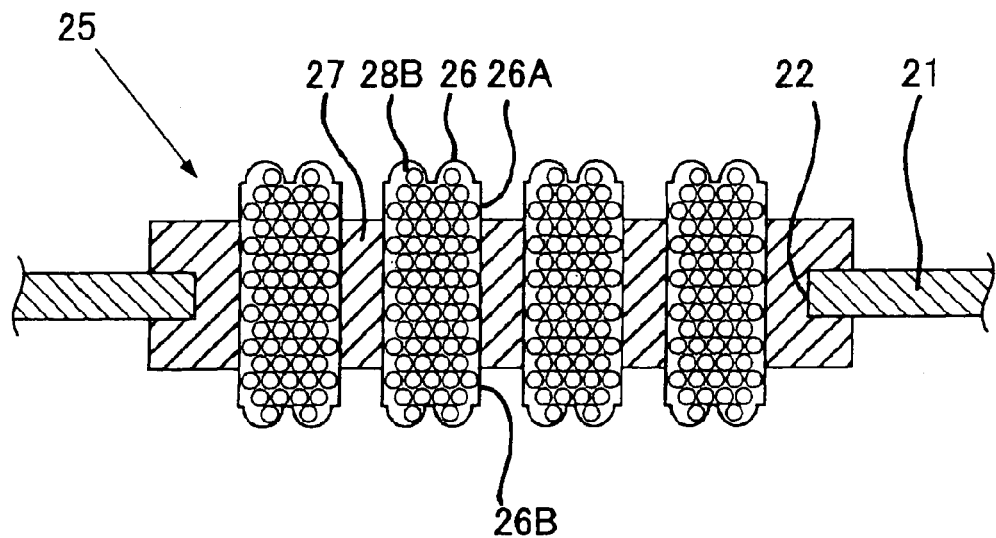
[FIG. 12] is a cross-sectional view illustrating another exemplary construction of respective conductive parts for connection in the anisotropically conductive connector.
Figure 13:
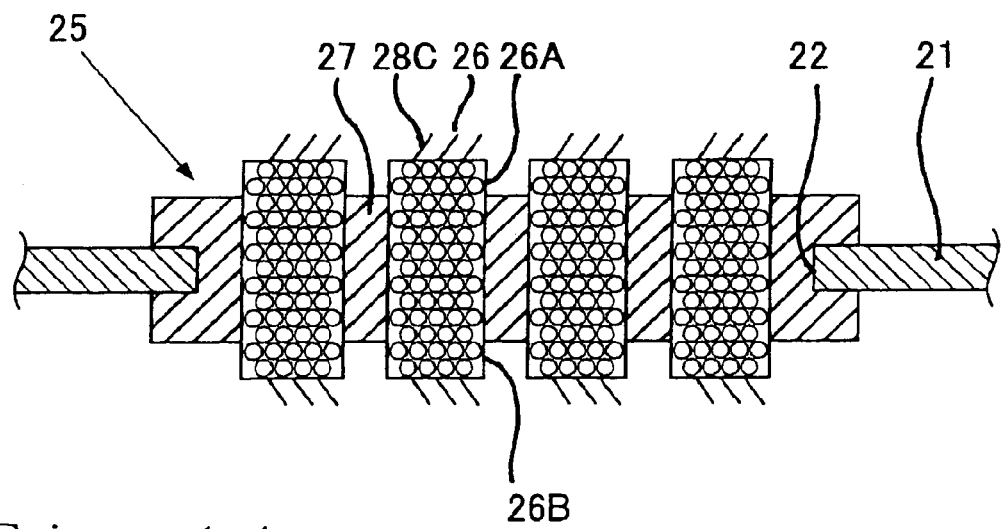
[FIG. 13] is a cross-sectional view illustrating the further exemplary construction of respective conductive parts for connection in the anisotropically conductive connector.

No particular limitation is imposed on the form of the finely projected part in each of the conductive parts 26 for connection, and it may be composed of, for example, a plurality of spherical finely projected portions 28B as illustrated in FIG. 12, or a plurality of wires 28C as illustrated in FIG. 13.

According to the wafer inspection apparatus equipped with such an anisotropically conductive connector, the irregularities-absorbing property of each elastic anisotropically conductive film 25 itself in the anisotropically conductive connector 20 for adjusting undulation is enhanced to improve the undulation adjusting function of the wafer inspection apparatus, whereby a good electrically connected state can be stably attained with higher certainty under a small load.

Figure 14:
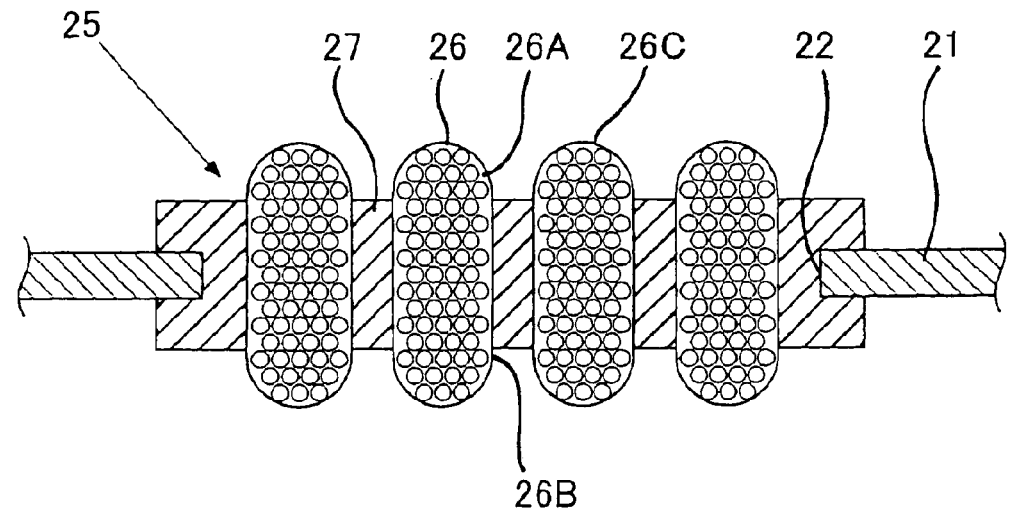
[FIG. 14] is a cross-sectional view illustrating the still further exemplary construction of respective conductive parts for connection in the anisotropically conductive connector.

The conductive parts 26 for connection in the anisotropically conductive connector 20 for adjusting undulation may be so constructed that they each have a projected part 26C in the form of a semi-sphere or spheroid as illustrated in FIG. 14, or a projected part in the form of a truncated cone that the diameter becomes smaller toward the tip thereof.

When an anisotropically conductive connector is used as the contact member, the anisotropically conductive connector may be so constructed that a DLC film is integrally formed on one or both surfaces of each of elastic anisotropically conductive films so as to cover at least an insulating part of the elastic anisotropically conductive film.

Figure 15:
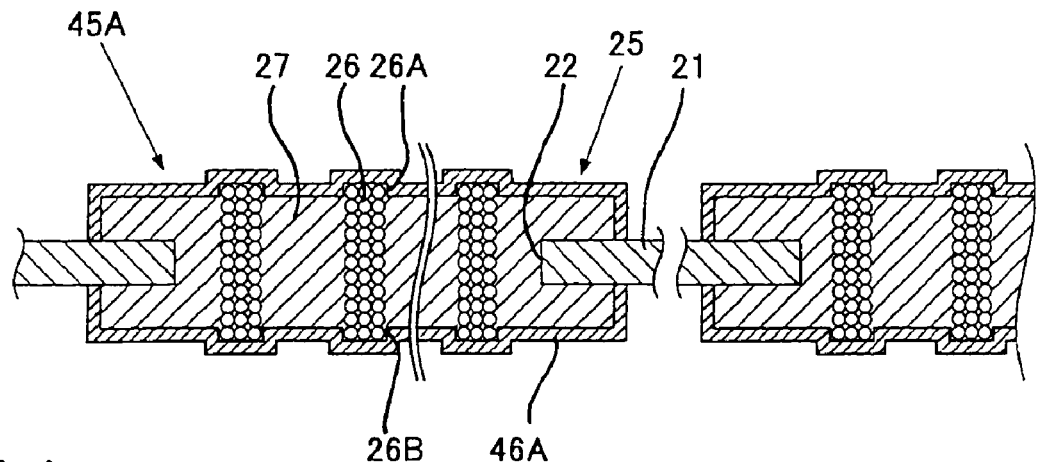
[FIG. 15] is a cross-sectional view illustrating the yet still further exemplary construction of the anisotropically conductive connector.

More specifically, in this anisotropically conductive connector 45A, the DLC film 46A is formed so as to cover the whole surface of the elastic anisotropically conductive film 46 as illustrated in, for example, FIG. 15. The basic construction of the anisotropically conductive connector is the same as the anisotropically conductive connector illustrated in FIG. 2 except that the DLC film 46A is provided. For the sake of convenience, like numerals or characters are given to the same constructive members.

The thickness of the DLC film 46A is preferably 1 to 500 nm, more preferably 2 to 50 nm.

The DLC film 46A preferably has a surface resistivity of $1 \times 10^8$ to $1 \times 10^{14} \Omega/\square$, more preferably $1 \times 10^{10}$ to $1 \times 10^{12} \Omega/\square$.

In the DLC film 46A, a ratio of a diamond bond to a graphite bond is preferably from 9:1 to 5:5, more preferably from 8:2 to 6:4, whereby a DLC film 46A having a surface resistivity within the above-described range is surely obtained.

According to a wafer inspection apparatus equipped with such an anisotropically conductive connector 45 for forming contact points, the wafer W can be prevented from being contaminated because the anisotropically conductive connector 45 for forming contact points, which comes into contact with the wafer W in the probe device 10 has the elastic anisotropically conductive films 46, on which the DLC film 46A has been formed. In addition, the elastic anisotropically conductive films 46 can be prevented from adhering to the wafer W even when they are left to stand for a long period of time in a state pressurized by the wafer W under a high-temperature environment, whereby it can be avoided to damage the elastic anisotropically conductive films 46 and the wafer W. Further, since the elastic anisotropically conductive films 46 can be prevented or inhibited from accumulating electric charge on the surfaces thereof, an adverse influence by static electricity can be eliminated.

Figure 16:
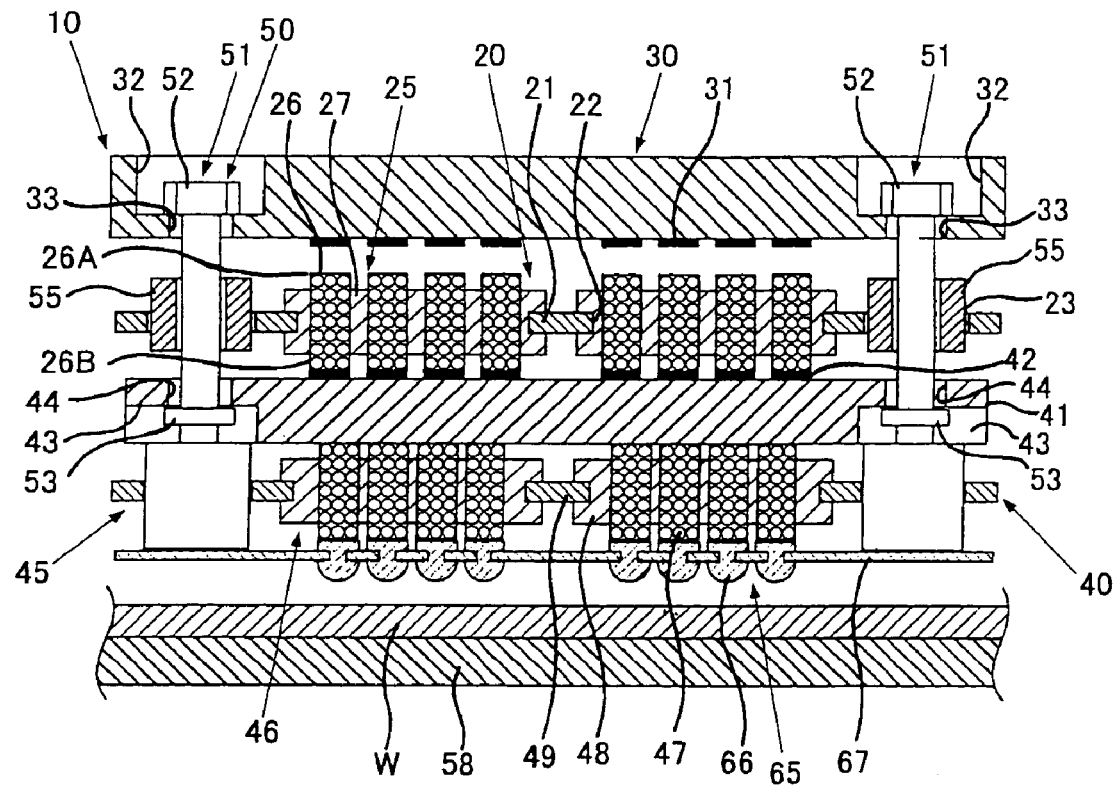
[FIG. 16] is a cross-sectional view illustrating, on an enlarged scale, the construction of a principal part of a further exemplary wafer inspection apparatus according to the present invention.
Figure 17:
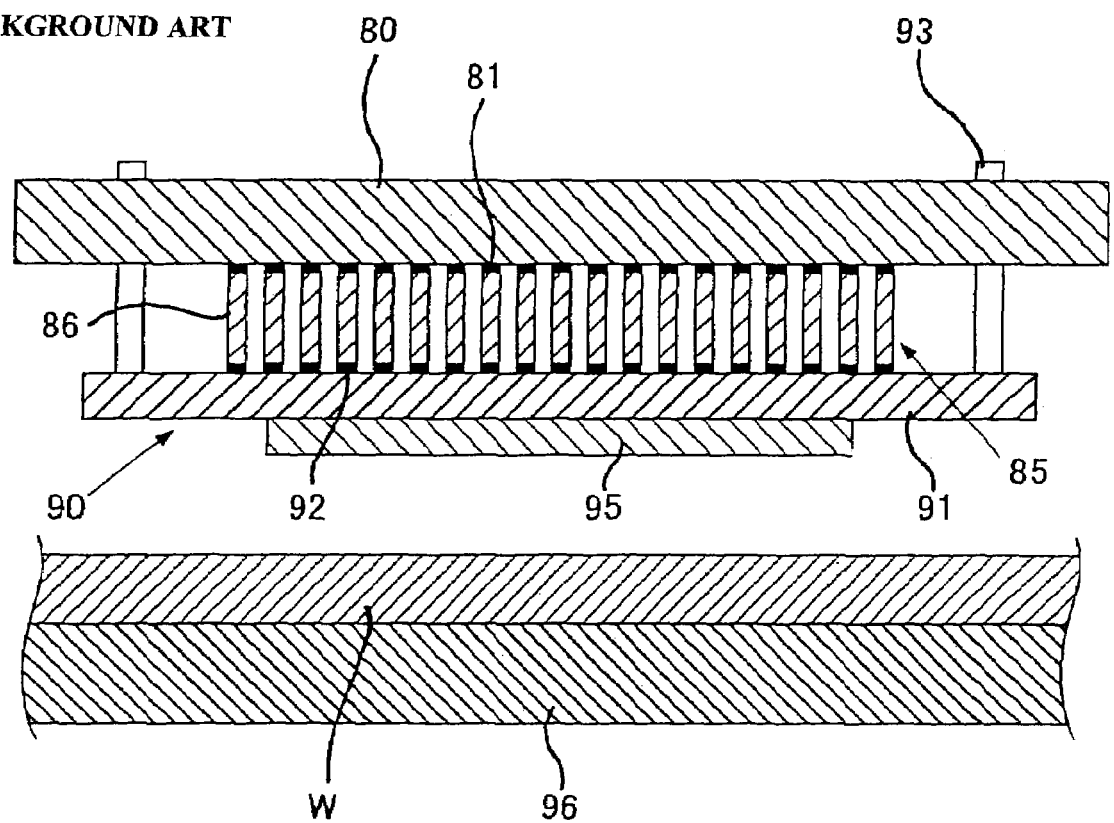
[FIG. 17] is a cross-view schematically illustrating the construction of an exemplary conventional wafer inspection apparatus.

Further, no particular limitation is imposed on the specific structure of the contact member in the probe card 40. For example, that in which contacts each composed of a blade or pin and a microspring pin are arranged, that in which contacts are composed of an anisotropically conductive sheet (for example, that having no frame plate 21 in the anisotropically conductive connector 45 illustrated in FIG. 2), that composed of a sheet-like connector, in which contacts each composed of a metallic body and extending through an insulating sheet in a thickness-wise direction thereof have been arranged in the insulating sheet, that obtained by laminating the anisotropically conductive connector 45 and a sheet-like connector 65 as illustrated in FIG. 16, or the like may be used. In FIG. 16, reference numeral 66 indicates a metallic body (contact), and 67 an insulating sheet.

EXAMPLES

The present invention will hereinafter be described specifically by the following examples. However, the present invention is not limited to these examples.

Example 1

(1) Production of Wafer for Evaluation:

On a wafer made of silicon (coefficient of linear thermal expansion: $3.3 \times 10^{-6}$/K) and having a diameter of 8 inches, sixty-four (64) rectangular integrated circuits in total, which each had dimensions of 11,000 μm in a lateral direction and 6,000 μm in a vertical direction, were formed so as to arrange eight (8) by eight (8) integrated circuits in vertical and lateral directions. Each of the integrated circuits formed on the wafer has a region of electrodes to be inspected at its center. In this region of the electrodes to be inspected, sixty (60) electrodes to be inspected each composed of copper and plated with gold on the surfaces thereof are arranged at a pitch of 120 μm in a line in the lateral direction. Every two electrodes among the sixty (60) electrodes to be inspected are electrically connected to each other. Each of the electrodes to be inspected has dimensions of 80 μm in a lateral direction and 170 μm in a vertical direction, and the total number of the electrodes to be inspected in the whole wafer is 3,840. All the electrodes to be inspected are electrically connected to a common lead electrode (not illustrated) formed at a peripheral edge of the wafer. This wafer will hereinafter be referred to as "Wafer W1 for evaluation". The plane precision of the silicon wafer itself in this Wafer W1 for evaluation was ±8 μm.

Further, sixty-four (64) integrated circuits, which had the same construction as in the Wafer W1 for evaluation except that no common lead electrode was formed as to the sixty (60) electrodes to be inspected in each integrated circuit, and the electrodes to be inspected were electrically insulated from one another, were formed on a wafer. The total number of the electrodes to be inspected in the whole of this wafer is 3,840. This wafer will hereinafter be referred to as "Wafer W2 for evaluation". The plane precision of the silicon wafer itself in this Wafer W2 for evaluation was ±10 μm.

(2) Production of Probe Card:

[Production of Anisotropically Conductive Connector for Forming Contact Points]

A mold for molding elastic anisotropically conductive films was first produced according to the construction shown in FIG. 3 under the following conditions.

Ferromagnetic base plates (71, 76):
    Material: iron; thickness: 6,000 μm;

Ferromagnetic substance layers (72, 77):
    Material: nickel; dimensions: 60 μm broad, 150 μm long, 50 μm thick; arrangement pitch (center distance): 120 μm; the number of ferromagnetic substance layers: 3,840 (sixty-four (64) regions in total, in each of which sixty (60) ferromagnetic substance layers were formed, were formed corresponding to the regions of the electrodes to be inspected of the integrated circuits in Wafer W1 for evaluation)

Non-magnetic substance layers (73):
    Material: cured product of dry film resist, thickness: 80 μm.

Non-magnetic substance layers (78):
  Material: cured product of dry film resist, thickness: 80 μm.
  Recesses (74A): 60 μm broad, 150 μm long, 30 μm deep
  Recesses (74B): 60 μm broad, 150 μm long, 30 μm deep A frame plate having a thickness of 60 μm and composed of 42 alloy (saturation magnetization: 1.7 Wb/m$^2$; coefficient of linear thermal expansion: 6.2×10$^{-6}$/K), in which sixty-four (64) elastic anisotropically conductive film-arranging holes (having dimensions of 7,600 μm in a lateral direction and 450 μm in a vertical direction) were formed corresponding to the respective regions of the electrodes to be inspected in Wafer W1 for evaluation, was produced, and moreover two (2) spacers for molding elastic anisotropically conductive films, which each have a thickness of 20 μm, composed of stainless steel (SUS304) and having a plurality of openings (rectangular form having dimensions of 8,600 μm in a lateral direction and 1,450 μm in a vertical direction) formed corresponding to the regions of the electrodes to be inspected in Wafer W1 for evaluation, were produced.

On the other hand, 55 parts by weight of conductive particles were added and mixed into 100 parts by weight of addition type liquid silicone rubber. Thereafter, the resultant mixture was subjected to a defoaming treatment by pressure reduction, thereby preparing a material for molding elastic anisotropically conductive films. In this material, as the conductive particles, were used those obtained by using nickel particles having an average particle diameter of 10 μm as core particles and subjecting the core particles to chemical plating with gold so as to give a coating weight of 25% by weight based on the weight of the core particles. As the addition type liquid silicone rubber, was used that of a two-pack type that the viscosity of Liquid A is 500 Pa·s, the viscosity of Liquid B is 500 Pa·s, and a cured product thereof has a compression set of 6% at 150° C., a durometer A hardness of 40 and tear strength of 30 kN/m.

In addition, properties of the addition type liquid silicone rubber described above were measured in the following manner.

(a) Viscosity of Addition Type Liquid Silicone rubber:
  A viscosity at 23±2° C. was measured by a Brookfield viscometer.

(b) Compression Set of Cured Silicon Rubber:
  Liquid A and Liquid B in the addition type liquid silicone rubber of the two-pack type were stirred and mixed in proportions that their amounts become equal. After this mixture was then poured into a mold and subjected to a defoaming treatment by pressure reduction, a curing treatment was conducted under conditions of 120° C. for 30 minutes, thereby producing a columnar body having a thickness of 12.7 mm and a diameter of 29 mm and composed of the cured silicon rubber. The columnar body was post-cured under conditions of 200° C. for 4 hours. The columnar body obtained in such a manner was used as a specimen to measure its compression set at 150±2° C. in accordance with JIS K 6249.

(c) Tear Strength of Cured Silicone Rubber:
  A curing treatment and post-curing of the addition type liquid silicone rubber were conducted under the same conditions as in the above item (b), thereby producing a sheet having a thickness of 2.5 mm. A crescent type specimen was prepared by punching from this sheet to measure its tear strength at 23±2° C. in accordance with JIS K 6249.

(d) Durometer A Hardness:
  Five (5) sheets produced in the same manner as in the above item (c) were stacked on one another, and the resultant laminate was used as a specimen to measure its durometer A hardness at 23±2° C. in accordance with JIS K 6249.

The frame plate was then arranged in alignment on an upper surface of the bottom force in the mold described above through the spacers, the top force was arranged in alignment on the frame plate through the spacers, and the molding material prepared above was filled in a molding cavity formed by the top force, the bottom force, the two spacers and the frame plate to form molding material layers.

The molding material layers formed between the top force and the bottom force was then subjected to a curing treatment under conditions of 100° C. and 1 hours while applying a magnetic field of 1.8 T by electromagnets to portions located between the ferromagnetic substance layers in a thicknesswise direction of each molding material layer, thereby forming an elastic anisotropically conductive film in each of the elastic anisotropically conductive film-arranging holes in the frame plate. The thus-formed films were taken out of the mold and then subjected to a post-curing treatment under conditions of 200° C. and 4 hours, thereby producing an anisotropically conductive connector for forming contact points.

The elastic anisotropically conductive films thus formed will be described specifically. Each of the elastic anisotropically conductive films has dimensions of 8,600 μm in a lateral direction and 1,450 μm in a vertical direction. In each of the elastic anisotropically conductive films, 3,840 in number conductive parts for connection corresponding to the electrodes to be inspected in Wafer W1 for evaluation are arranged at a pitch of 120 μm. Each of the conductive parts for connection has dimensions of 60 μm in the lateral direction, 150 μm in the vertical direction and 160 μm in thickness. The projected height of a projected part on the side of one surface to be connected to Wafer W1 for evaluation is 30 μm, the projected height of a projected part on the side of the other surface to be connected to the circuit board for connection is 30 μm, the thickness of each of the insulating parts is 100 μm, and the thickness (thickness of one of the forked portions) of a portion supported by the frame plate in each of the elastic anisotropically conductive films is 20 μm. The content of the conductive particles in the conductive parts for connection in each of the elastic anisotropically conductive films was investigated. As a result, the content was about 30% in terms of a volume fraction in all the conductive parts for connection.

The degree of scatter of the thickness in the whole of this anisotropically conductive connector for forming contact points was ±5 μm.

Alumina ceramic (coefficient of linear thermal expansion: 4.8×10$^{-6}$/K) was used as a base material to form, on a front surface thereof, front surface electrodes in accordance with a pattern corresponding to the pattern of the electrodes to be inspected of the integrated circuits in Wafer W1 for evaluation and form, on a back surface thereof, terminal electrodes (back surface electrodes) connected to the respective front surface electrodes, thereby providing a circuit board for connection (that identified as a non-defective product in advance). The anisotropically conductive connector for forming contact points was arranged on a front surface of this circuit board for connection in a state that the anisotropically conductive connector for forming contact points was brought into contact with the circuit board for connection to electrically connect the respective conductive parts for connection in the anisotropically conductive connector for forming contact points to the respective terminal electrodes in the circuit board for connection, thereby producing a probe card. Here, this circuit board for connection has dimensions of 10 cm×10 cm as a whole and is square, and the plane precision thereof is ±10 μm. The terminal electrodes (back surface electrodes) each have a diameter of 400 μm and are arranged in a state that ten (10) by six (6) electrodes have been aligned at a pitch of 800 μm in lateral and vertical directions, respectively. The front surface electrodes each have dimensions of 80 μm in the lateral direction and 170 μm in the vertical direction and are arranged at a pitch of 120 μm in a line in the lateral direction.

(3) Production of Anisotropically Conductive Connector for Adjusting Undulation:

A mold having the same construction as in the above-described production example of the anisotropically conductive connector for forming contact points except that the dimensions of the ferromagnetic substance layers (72, 77) were changed to 300 μm in diameter and 100 μm in thickness, and the dimensions of the recesses (74A, 74B) for forming conductive parts for connection were changed to 300 μm in diameter and 100 μm in depth was produced.

As a frame plate, was provided that having a thickness of 100 μm and composed of stainless steel (SUS304, saturation magnetization: 0.01 Wb/m$^2$; coefficient of linear thermal expansion: $1.7\times10^{-5}$/K), and as an upper-side spacer and a lower-side spacer for molding elastic anisotropically conductive films, were provided those having a thickness of 50 μm and composed of stainless steel (SUS304). Here, the elastic anisotropically conductive film-arranging holes in the frame plate each have dimensions of 8,000 μm in a lateral direction and 4,800 μm in a vertical direction, and the openings in the spacers each have dimensions of 9,000 μm in the lateral direction and 5,800 μm in the vertical direction.

On the other hand, 42 parts by weight of conductive particles were added and mixed into 100 parts by weight of addition type liquid silicone rubber. Thereafter, the resultant mixture was subjected to a defoaming treatment by pressure reduction, thereby preparing a material for molding elastic anisotropically conductive films. In this material, as the conductive particles, were used those obtained by using nickel particles having an average particle diameter of 40 μm as core particles and subjecting the core particles to chemical plating with gold so as to give a coating weight of 15% by weight based on the weight of the core particles. As the addition type liquid silicone rubber, was used that of a two-pack type that the viscosity of Liquid A is 180 Pa·s, the viscosity of Liquid B is 180 Pa·s, and a cured product thereof has a compression set of 5% at 150° C., a durometer A hardness of 23 and tear strength of 8 kN/m.

Elastic anisotropically conductive films were formed in the respective elastic conductive film-arranging holes in the frame plate in the same manner as described above except for the above-described manner, thereby producing an anisotropically conductive connector for adjusting undulation.

The elastic anisotropically conductive films thus formed will be described specifically. Each of the elastic anisotropically conductive films has dimensions of 9,000 μm in a lateral direction and 5,800 μm in a vertical direction. In each of the elastic anisotropically conductive films, 3,840 in number conductive parts for connection corresponding to the terminal electrodes (back surface electrodes) in the probe card are arranged at a pitch of 800 μm. Each of the conductive parts for connection is such that the diameter is 300 μm, the overall thickness is 400 μm, the projected height of each of the projected part on the one surface side and the projected part on the other surface side is 100 μm, the thickness of the insulating part is 200 μm, and the thickness (thickness of one of the forked portions) of a portion supported by the frame plate in each of the elastic anisotropically conductive films is 50 μm. The content of the conductive particles in the conductive parts for connection in each of the elastic anisotropically conductive films was investigated. As a result, the content was about 30% in terms of a volume fraction in all the conductive parts for connection.

The degree of scatter of the thickness in the whole of this anisotropically conductive connector for adjusting undulation was ±10 μm.

(4) Production of Probe Device:

Positioning holes, into each of which a spacer for regulating a deformation quantity is fitted and arranged, are first formed at positions of four (4) corners of the frame plate in the anisotropically conductive connector for adjusting undulation. Alumina ceramic (coefficient of linear thermal expansion: $4.8\times10^{-6}$/K) was used as a base material to form inspection electrodes thereon in accordance with a pattern corresponding to the pattern of the electrodes to be inspected of the integrated circuits in Wafer W1 for evaluation, thereby providing a circuit board for inspection (that identified as a non-defective product in advance). Recesses and through-holes for arranging a location-varying mechanism were formed in this circuit board for inspection at positions corresponding to the positioning holes of the anisotropically conductive connector for adjusting undulation, and recesses and through-holes for arranging a location-varying mechanism were formed in the circuit board for connection at positions corresponding to the positioning holes of the anisotropically conductive connector for adjusting undulation. Here, the circuit board for inspection has a thickness of 5 mm and a diameter of 30 cm and is in the form of a circular plate. The plane precision of a region thereof, in which the inspection electrodes are formed, is ±10 μm. The inspection electrodes each have a diameter of 400 μm and are arranged at a pitch of 800 μm. The opening diameter of each of the through-holes for arranging a location-varying mechanism in the circuit board for inspection and the circuit board for connection is 3,000 μm.

A cylindrical spacer composed of aluminum and having an outer diameter of 9,000 μm, an inner diameter of 3,500 μm and a thickness of 250 μm (55% of the overall thickness of the anisotropically conductive connector for adjusting undulation) was then arranged in each of the positioning holes in the frame plate of the anisotropically conductive connector for adjusting undulation, and as illustrated in FIG. 2, each of bolts was installed from one surface side of the circuit board for inspection in such a manner that a head thereof is locked with an opening edge of the through-hole in the recess of the circuit board for inspection, a shaft thereof is passed through the through-hole, an interior space of the spacer for regulating the deformation quantity and the through-hole in the recess of the circuit board for connection, and a proximal portion of the shaft is exposed to within the recess of the circuit board for connection. A nut was screwed and provided on the proximal portion of each of the bolts, thereby producing a probe card according to the present invention, in which the anisotropically conductive connector for adjusting undulation is arranged in a state positioned in such a manner that the respective conductive parts for connection in the elastic anisotropically conductive films thereof are located on the terminal electrodes of the probe card, and the circuit board for inspection is arranged in a state positioned in such a manner that the respective inspection electrodes thereof are located on the conductive parts for connection in the anisotropically conductive connector for adjusting undulation. As the bolts making up the location-varying mechanisms, were used precision screws each having a nominal diameter of 3.0 mm and a pitch of 0.35 mm.

[Evaluation of Probe Device]

Wafer W1 for evaluation was arranged on a test table equipped with a heater, and the probe device was arranged in alignment in such a manner that the respective conductive parts for connection in the anisotropically conductive connector for forming contact points are located on the electrodes to be inspected in Wafer W1 for evaluation. Here, the plane precision of the test table is ±10 μm.

Each of the nuts making up the location-varying mechanisms in the probe device was fastened in a uniform fastening degree, whereby the three parties of the circuit board for inspection, the anisotropically conductive connector for adjusting undulation and the circuit board for connection are temporarily fixed in a state that the elastic anisotropically conductive films in the anisotropically conductive connector for adjusting undulation have been pinched by the circuit board for inspection and the circuit board for connection and compressed in the thickness-wise direction thereof, thereby electrically connecting the respective inspection electrodes in the circuit board for inspection to the respective terminal electrodes in the circuit board for connection through the respective conductive parts for connection in the anisotropically conductive connector for adjusting undulation.

In this state, the degree of scatter of the height level of the surface of the probe card, on which the terminal electrodes have been formed, to the surface of Wafer for evaluation, on which the electrodes to be inspected have been formed, is ±15 μm, and the degree of scatter of the height level of the surface of the circuit board for inspection, on which the inspection electrodes have been formed, to the surface of Wafer for evaluation, on which the electrodes to be inspected have been formed, is ±20 μm.

The test table, on which the Wafer W1 for evaluation has been arranged, is moved upward, whereby the respective conductive parts for connection in the anisotropically conductive connector for forming contact points are brought into contact with the respective electrode to be inspected in Wafer W1 for evaluation. From this state, the probe device is further pressurized upward, thereby measuring an electric resistance value of each of the conductive parts for connection in the anisotropically conductive connector in a state that the electrically connected state has been attained. The correction quantity of the fastening quantity of the nut in each of the location-varying mechanisms is set in such a manner that the resulting electric resistance values become substantially even, and the fastening quantity of the nut in each of the location-varying mechanisms is individually adjusted on the basis of this correction quantity. This operation is conducted repeatedly as needed to adjust the parallelism of the whole wafer inspection apparatus, thereby setting an inspection initial state. In this operation, the inspection initial state was set to a state that the electric resistance values of all the conductive parts for connection of the elastic anisotropically conductive films in the anisotropically conductive connector for adjusting undulation are 0.1 Ω or lower (the electric resistance values consist with one another within a range of ±50 mΩ), and a state that the pinch pressure against the elastic anisotropically conductive films by the circuit board for inspection and the circuit board for connection is 8 g per one conductive part for connection.

The test table was moved upward to bring the respective conductive parts for connection in the anisotropically conductive connector for forming contact points into contact with the respective electrodes to be inspected in Wafer W1 for evaluation. From this state, the prove device was further pressurized upward under a load of 38 kg (load applied to one conductive part for connection of the anisotropically conductive connector for forming contact points: about 10 g on the average). In this state, the following Test 1 was performed, thereby investigating the electrically connected state of the inspection electrodes of the circuit board for inspection to the electrodes to be inspected of Wafer W1 for evaluation. As a result, a proportion of conductive parts for connection that a conduction resistance was lower than 1Ω was 100%. In addition, Wafer W2 for evaluation was used to set the inspection initial state in the same manner as described above, the test table was moved upward to pressurize the probe device, thereby bringing the respective conductive parts for connection in the anisotropically conductive connector for forming contact points into contact with the electrodes to be inspected in Wafer W2 for evaluation. From this state, the prove device was further pressurized upward under a load of 38 kg (load applied to one conductive part for connection of the anisotropically conductive connector for forming contact points: about 10 g on the average). In this state, the following Test 2 was performed, thereby investigating the electrically connected state of the inspection electrodes of the circuit board for inspection to the electrodes to be inspected of Wafer W2 for evaluation. As a result, a proportion of pairs of conductive parts that an insulation resistance was 10 MΩ or higher was 0%. It was thus confirmed that a good electrically connected state was attained to all the electrodes to be inspected.

Test 1:

At room temperature (25° C.), an electric resistance between each of the 3,840 in number inspection electrodes in the circuit board for inspection and the lead electrode of Wafer W1 for evaluation was successively measured as an electric resistance (hereinafter referred to as "conduction resistance") of the conductive parts for connection to calculate out a proportion of conductive parts for connection that the conduction resistance was lower than 1Ω.

Test 2:

At room temperature (25° C.), an electric resistance between adjoining two inspection electrodes in the circuit board for inspection was successively measured as an electric resistance (hereinafter referred to as "insulation resistance") between adjoining two conductive parts for connection (hereinafter referred to as "pair of conductive parts") to calculate out a proportion of pairs of conductive parts that the insulation resistance was 10 MΩ or higher.

By the whole probe device, the test table was heated to 85° C. in a state that Wafer W1 for evaluation had been pressed under the above-described conditions to perform Test 1 in the same manner as described above. As a result, a proportion of conductive parts for connection that the conduction resistance was lower than 1Ω was 100%.

In addition, Wafer W2 for evaluation was used to set the inspection initial state in the same manner as described above, and Test 2 was performed in the same manner as described above. As a result, a proportion of pairs of conductive parts that the insulation resistance was 10 MΩ or higher was 0%. It was thus confirmed that a good electrically connected state is retained to all the electrodes to be inspected, and a good electrically connected state can be stably attained even upon environmental changes such as thermal hysteresis by temperature change.

Further, in this probe device, it was confirmed that the deformation quantity (overdrive quantity) of the elastic anisotropically conductive films at the time the conductive parts for connection in the anisotropically conductive connector for forming contact points were pressurized from the state brought into contact with the electrodes to be inspected in the wafer for evaluation to the inspectable state is 80 μm, and the expected irregularities-absorbing property is attained under a small load.

Example 2

A probe device having the same construction as that produced in Example 1 except that spacers of the construction shown below were used as the spacers for regulating a deformation quantity in Example 1, and such spacers were arranged on both surfaces of the frame plate in the anisotropically conductive connector for adjusting undulation was produced (cf. FIG. 5).

[Construction of Spacer]

The spacers are constructed by a rectangular frame-like plate part having opening in regions corresponding to regions, in which the elastic anisotropically conductive films in the anisotropically conductive connector for adjusting undulation have been formed, and a plurality of finely projected portions composed of an elastic substance and formed on both surfaces of this plate part.

The plate part is composed of stainless steel and having a thickness of 50 μm. The finely projected portions are composed of silicone rubber and in a columnar form that the diameter is 50 μm, and the projected height is 40 μm (20% of the overall thickness of the anisotropically conductive connector for adjusting undulation).

The total thickness of the two spacers including the frame plate in the anisotropically conductive connector for adjusting undulation is 360 μm (90% of the overall thickness of the anisotropically conductive connector for adjusting undulation).

[Evaluation of Probe Device]

In this probe device, when the three parties of the circuit board for inspection, the anisotropically conductive connector for adjusting undulation and the circuit board for connection are temporarily fixed in a state that the elastic anisotropically conductive films in the anisotropically conductive connector for adjusting undulation have been pinched by the circuit board for inspection and the circuit board for connection and compressed in the thickness-wise direction thereof, the degree of scatter of the height level of the surface of the probe card, on which the terminal electrodes have been formed, to the surface of Wafer W1 for evaluation, on which the electrodes to be inspected have been formed, is ±20 μm, and the degree of scatter of the height level of the surface of the circuit board for inspection, on which the inspection electrodes have been formed, to the surface of Wafer W1 for evaluation, on which the electrodes to be inspected have been formed, is ±25 μm.

The parallelism of the whole of the wafer inspection apparatus was adjusted, thereby setting an inspection initial state (the same inspection initial state as in Example 1), and the test table was moved upward to bring the respective conductive parts for connection in the anisotropically conductive connector for forming contact points into contact with the respective electrodes to be inspected in Wafer W1 for evaluation. From this state, the prove device was further pressurized upward under a load of 38 kg (load applied to one conductive part for connection of the anisotropically conductive connector for forming contact points: about 10 g on the average). In this state, Test 1 was performed in the same manner as in Example 1, thereby investigating the electrically connected state of the inspection electrodes of the circuit board for inspection to the electrodes to be inspected of Wafer W2 for evaluation. As a result, a proportion of conductive parts for connection that the conduction resistance was lower than 1Ω was 100%.

In addition, Wafer W2 for evaluation was used to perform Test 2 in the same manner as in Example 1, thereby investigating the electrically connected state of the inspection electrodes of the circuit board for inspection to the electrodes to be inspected of Wafer W2 for evaluation. As a result, a proportion of pairs of conductive parts that the insulation resistance was 10 MΩ or higher was 0%. It was thus confirmed that a good electrically connected state was attained to all the electrodes to be inspected.

By the whole probe device, the test table was heated to 85° C. in a state that Wafer W1 for evaluation had been pressed under the above-described conditions to perform Test 1 in the same manner as described above. As a result, a proportion of conductive parts for connection that the conduction resistance was lower than 1Ω was 100%.

In addition, Wafer W2 for evaluation was used to set the inspection initial state in the same manner as described above, and Test 2 was performed in the same manner as described above. As a result, a proportion of pairs of conductive parts that the insulation resistance was 10 MΩ or higher was 0%. It was thus confirmed that a good electrically connected state is retained to all the electrodes to be inspected, and a good electrically connected state can be stably attained even upon environmental changes such as thermal hysteresis by temperature change.

Further, in this probe device, it was confirmed that the deformation quantity (overdrive quantity) of the elastic anisotropically conductive films at the time the conductive parts for connection in the anisotropically conductive connector for forming contact points were pressurized from the state brought into contact with the electrodes to be inspected in the wafer for evaluation to the inspectable state is 100 μm, and the expected irregularities-absorbing property is attained under a small load.

Comparative Example 1

A comparative probe device having the same construction as that produced in Example 1 except that none of the location-varying mechanisms making up the parallelism adjusting mechanism in Example 1 were provided was produced. This probe device was evaluated in the same manner as in Example 1. As a result, connection failure to a part of the electrodes to be inspected was observed, and so a good electrically connected state cannot be attained.

The invention claimed is:

1. A probe device suitable for use in conducting electrical inspection of a great number of integrated circuits formed on a wafer, which comprises:

a circuit board for inspection having a great number of inspection electrodes on a front surface thereof;

a probe card having a circuit board for connection, on the back surface of which a plurality of terminal electrodes have been formed in accordance with a pattern corresponding to a pattern of the inspection electrodes of the circuit board for inspection, and a contact member, which is provided on a front surface of the circuit board for connection, and on which a great number of contacts brought into contact with respective electrodes to be inspected of the integrated circuits on the wafer, which is an object of inspection, are arranged, in which the respective terminal electrodes of the circuit board for connection are arranged so as to be opposed to the inspection electrodes of the circuit board for inspection;

an anisotropically conductive connector, which is arranged between the circuit board for inspection and the circuit board for connection in the probe card, and electrically connects the respective inspection electrodes to the respective terminal electrodes by being pinched by the circuit board for inspection and the circuit board for connection; and a parallelism adjusting mechanism for adjusting a parallelism of the circuit board for inspection to the wafer and a parallelism of the circuit board for connection to the wafer, wherein the parallelism adjusting mechanism is equipped with a location-varying mechanism, which relatively displaces the circuit board for inspection or the circuit board for connection in a thickness-wise direction of the anisotropically conductive connector;

wherein spacers for regulating the deformation quantity of the anisotropically conductive connector are provided between the circuit board for inspection and the circuit board for connection in the probe card;

wherein the anisotropically conductive connector is composed of a frame plate, in which a plurality of anisotropically conductive film-arranging holes each extending in a thickness-wise direction of the frame plate have been formed corresponding to electrode regions, in which electrodes intended to be connected in the circuit board for connection and the circuit board for inspection have been arranged, and a plurality of elastic anisotropically conductive films arranged in the respective anisotropically conductive film-arranging holes in this frame plate and each supported by the peripheral edge of the anisotropically conductive film-arranging hole, and wherein the spacers are arranged on both sides of the frame plate in the anisotropically conductive connector, and the spacers are each in the form of a frame, in which openings are formed in regions corresponding to the regions where the elastic anisotropically conductive films in the anisotropically conductive connector have been formed, and have finely projected portions each composed of an elastic member on at least contact surfaces with the circuit board for inspection and contact surfaces with the circuit board for connection.

2. The probe device according to claim 1, wherein the parallelism adjusting mechanism is equipped with a plurality of location-varying mechanisms, and each of the location-varying mechanisms is so constructed that the quantity of displacement of the circuit board for inspection or the circuit board for connection is set independently of each other.

3. The probe device according to claim 1, wherein the overall thickness of the spacer is at least 50% of the overall thickness of the anisotropically conductive connector.

4. The probe device according to claim 1, wherein the total thickness of the thickness of the spacers including the finely projected portions and the thickness of the frame plate in the anisotropically conductive connector is at least 90% of the overall thickness of the anisotropically conductive connector.

5. The probe device according to claim 4, wherein the contact member making up the probe card is formed by that equipped with an anisotropically conductive sheet, in which a plurality of conductive parts for connection each extending in a thickness-wise direction of the sheet are insulated from each other by an insulating part.

6. The probe device according to claim 5, wherein the contact member making up the probe card is constructed by an anisotropically conductive sheet, in which a plurality of conductive parts for connection each extending in a thickness-wise direction of the sheet are insulated from each other by an insulating part, or an anisotropically conductive connector, in which the anisotropically conductive sheet is supported by a frame plate, and a sheet-like connector composed of an insulating sheet arranged on a front surface of the anisotropically conductive sheet or the anisotropically conductive connector and a plurality electrode structures each extending through the insulating sheet in the thickness-wise direction thereof and arranged in accordance with a pattern corresponding to a pattern of electrodes to be inspected.

7. A wafer inspection apparatus for conducting electrical inspection of a great number of integrated circuits formed on a wafer, which comprises the probe device according to any one of claims 1, 2, 3, and 4 to 6.

8. A wafer inspection method comprising:

relatively displacing a circuit board for inspection or a circuit board for connection by location-varying mechanisms making up a parallelism adjusting mechanism to temporarily fix the circuit board for inspection, an anisotropically conductive connector and the circuit board for connection in a state that the anisotropically conductive connector has been pinched by the circuit board for inspection and the circuit board for connection, thereby electrically connecting inspection electrodes in the circuit board for inspection to their corresponding terminal electrodes in the circuit board for connection through conductive parts for connection in the anisotropically conductive connector, wherein the anisotropically conductive connector is composed of a frame plate, in which a plurality of anisotropically conductive film-arranging holes each extending in a thickness-wise direction of the frame plate have been formed corresponding to electrode regions, in which electrodes intended to be connected in the circuit board for connection and the circuit board for inspection have been arranged, and a plurality of elastic anisotropically conductive films arranged in the respective anisotropically conductive film-arranging holes in this frame plate and each supported by the peripheral edge of the anisotropically conductive film-arranging hole, providing spacers for regulating the deformation quantity of the anisotropically conductive connector between the circuit board for inspection and the circuit board for connection in a probe card and arranging the spacers on both sides of the frame plate in the anisotropically conductive connector, wherein the spacers are each in the form of a frame, in which openings are formed in regions corresponding to the regions where the elastic anisotropically conductive films in the anisotropically conductive connector have been formed, and have finely projected portions each composed of an elastic member on at least contact surfaces with the circuit board for inspection and contact surfaces with the circuit board for connection, using a probe device to measure a parallelism of the circuit board for inspection to a wafer and a parallelism of the circuit board for connection to the wafer and bringing a contact member in the probe card into contact with the wafer that is an object of inspection, setting a correction quantity of the quantity of displacement by the location-varying mechanism on the basis of results obtained, conducting an inspection initial state-setting operation for adjusting the quantity of displacement on the basis of the correction quantity, thereby adjusting a parallelism of the circuit board for inspection to the wafer and a parallelism of the circuit board for connection to the wafer, and bringing the probe device into contact with the wafer in a state that displacement of the circuit board for inspection or the circuit board for connection in a direction that a clearance between the circuit board for inspection and the circuit board for connection becomes great has been prohibited, thereby conducting electrical inspection.

9. The wafer inspection method according to claim 8, wherein the parallelism adjusting mechanism is equipped with a plurality of location-varying mechanisms, electric resistance values of the respective conductive parts for connection in the anisotropically conductive connector are measured in a state that the contact member in the probe card is brought into contact with the wafer, and the correction quantity of the quantity of displacement by the respective location-varying mechanisms is set in such a manner that the distribution of the resultant electric resistance values becomes an even state.

10. The wafer inspection method according to claim 8 or 9, wherein the inspection initial state is set in such manner that the respective electrical resistance values of the conductive parts for connection in the anisotropically conductive connector are at most $0.1\Omega$, and a load per one conductive part for connection in the anisotropically conductive connector is 0.01 to 0.4 N.

* * * * *